United States Patent
Onuki et al.

(10) Patent No.: US 9,542,977 B2
(45) Date of Patent: Jan. 10, 2017

(54) SEMICONDUCTOR DEVICE AND ELECTRONIC DEVICE

(71) Applicant: Semiconductor Energy Laboratory Co., Ltd., Atsugi-shi, Kanagawa-ken (JP)

(72) Inventors: Tatsuya Onuki, Kanagawa (JP); Kiyoshi Kato, Kanagawa (JP); Yutaka Shionoiri, Kanagawa (JP); Tomoaki Atsumi, Kanagawa (JP); Takanori Matsuzaki, Kanagawa (JP); Hiroki Inoue, Kanagawa (JP); Shuhei Nagatsuka, Kanagawa (JP); Yuto Yakubo, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/681,570

(22) Filed: Apr. 8, 2015

(65) Prior Publication Data

US 2015/0294693 A1 Oct. 15, 2015

(30) Foreign Application Priority Data

Apr. 11, 2014 (JP) ................... 2014-081616

(51) Int. Cl.
*G11C 5/02* (2006.01)
*H01L 29/24* (2006.01)
(Continued)

(52) U.S. Cl.
CPC ........... *G11C 5/025* (2013.01); *G11C 11/4091* (2013.01); *G11C 11/4097* (2013.01); *H01L 27/1207* (2013.01); *H01L 29/24* (2013.01)

(58) Field of Classification Search
None
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Asakuma.N. et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

(Continued)

*Primary Examiner* — James G Norman
(74) *Attorney, Agent, or Firm* — Fish & Richardson P.C.

(57) ABSTRACT

Provided is a semiconductor device which can achieve a reduction in its area, reduction in power consumption, and operation at a high speed. A semiconductor device 10 has a structure in which a circuit 31 including a memory circuit and a circuit 32 including an amplifier circuit are stacked. With this structure, the memory circuit and the amplifier circuit can be mounted on the semiconductor device 10 while the increase in the area of the semiconductor device 10 is suppressed. Thus, the area of the semiconductor device 10 can be reduced. Further, the circuits are formed using OS transistors, so that the memory circuit and the amplifier circuit which have low off-state current and which can operate at a high speed can be formed. Therefore, a reduc- (Continued)

tion in power consumption and improvement in operation speed of the semiconductor device 10 can be achieved.

20 Claims, 17 Drawing Sheets

(51) Int. Cl.
*H01L 27/12* (2006.01)
*G11C 11/4091* (2006.01)
*G11C 11/4097* (2006.01)

(56) References Cited

U.S. PATENT DOCUMENTS

| | | | |
|---|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,879,539 B2 | 4/2005 | Kawasaki |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,508,967 B2 | 8/2013 | Yamazaki et al. |
| 8,780,614 B2 | 7/2014 | Takemura |
| 8,809,927 B2 | 8/2014 | Takemura |
| 8,896,046 B2 | 11/2014 | Kato |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0202404 A1 | 10/2003 | Scheuerlein |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0263423 A1 | 11/2007 | Scheuerlein et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0219750 A1* | 9/2009 | Tokiwa ............... G11C 5/02 365/148 |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2011/0089417 A1 | 4/2011 | Yamazaki et al. |
| 2011/0101332 A1 | 5/2011 | Yamazaki et al. |
| 2011/0101351 A1 | 5/2011 | Yamazaki |
| 2012/0033483 A1* | 2/2012 | Koyama ............ G11C 11/405 365/149 |
| 2012/0063208 A1 | 3/2012 | Koyama et al. |
| 2012/0188814 A1 | 7/2012 | Yamazaki et al. |
| 2013/0148411 A1 | 6/2013 | Atsumi et al. |
| 2015/0294710 A1 | 10/2015 | Onuki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-221374 A | 8/2004 |

(56) References Cited

FOREIGN PATENT DOCUMENTS

| | | |
|---|---|---|
| JP | 2004-273614 A | 9/2004 |
| JP | 2004-273732 A | 9/2004 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for Amoled Back Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZNO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn-O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA Amoled Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission Amoled Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, Vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, NI, Cu, or Zn] at temperatures Over 1000° C", Journal of Solid State Chemistry, 1985, vol. 60, pp. 382-384.

Kimizuka.N. et al., "Syntheses and Single-Crystal Data of Homologous Compounds, In2O3(ZnO)m (m = 3, 4, and InGaO3(ZnO)3, and Ga2O3(ZnO)m (m = 7, 8, 9, and 16) in the InO3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of Am-Oled ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

(56) References Cited

OTHER PUBLICATIONS

Mo.Y et al., "Amorphous Oxide TFT Backplanes for Large Size Amoled Displays", IDW '08 : Proceedings of the 6th International Display Workshops, Dec. 3, 2008, pp. 581-584.
Nakamura.M et al., The phase relations in the In2O3—Ga2ZnO4—ZnO system at 1350° C, Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp, 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 in. QVGA Amoled Display Using In—Ga—Zn—Oxide TFTS With a Novel Passivation Layer", SID Digest '09 : SID International Symposium Digest of Technical Papers, May 31, 2009, pp. 284-287.
Ohara.H et al., "Amorphous In—Ga—Zn—Oxide TFTs with Suppressed Variation for 4.0 inch QVGA Amoled Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosphical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Park.J et al., "Amorphous Indium—Gallium—Zinc Oxide TFTS and Their Application for Large Size Amoled", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent Am-Oled Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission Am-Oled Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-in. Amoled Display With Driver Circuit Using Amorphous In—Ga—Zn—Oxide TFTS", IDW '09 : Proceedings of the 16th International Display Workshops, 2009, pp. 689-692.
Son.K et al., "42.4L: Late-News Paper: 4 Inch QVGA Amoled Driven by the Threshold Voltage Controlled Amorphous Gizo (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International display Workshops, Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

SEMICONDUCTOR DEVICE AND ELECTRONIC DEVICE

BACKGROUND OF THE INVENTION

1. Field of the Invention

One embodiment of the present invention relates to a semiconductor device including a memory circuit and an amplifier circuit Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Another embodiment of the present invention relates to a semiconductor device, a display device, a lighting device, a power storage device, a memory device, or a driving method or manufacturing method thereof.

2. Description of the Related Art

A dynamic random access memory (DRAM) is a volatile memory capable of high-speed writing and reading of data, which is widely used for various memory devices. Cost reduction is desired for an increase in the capacity of a DRAM and research and development have been actively performed on the increase in the capacity of the DRAM by changing the layout of a memory cell, miniaturizing an element included in the memory cell, and the like.

In a general DRAM, a memory cell is connected to a sense amplifier. A minute difference in voltage that is generated when a charge held in the memory cell is discharged to a bit line is amplified by the sense amplifier, whereby data stored in the memory cell can be read out.

Patent Document 1 discloses a technique in which the area of a sense amplifier region is reduced for a reduction in the area of a chip in a structure where the sense amplifier region is provided between a plurality of memory cell array regions.

Patent Document

[Patent Document 1] Japanese Published Patent Application No. 2004-221374

SUMMARY OF THE INVENTION

In a DRAM, a reduction in the size of a memory cell and miniaturization of an element have limits; thus, the increase in capacity by such methods has been getting technically difficult. Further, for a DRAM, a sense amplifier is provided in addition to a memory cell. Because the sense amplifier occupies a certain area, the area of a region where the memory cell is provided is limited and the increase in capacity is hindered.

Patent Document 1 discloses a technique for reducing the area of a sense amplifier region; however, because the sense amplifier is provided between memory cell arrays, the installation area for the memory cell arrays is limited and thus the increase in capacity above a certain level is difficult.

In view of the technical background, an object of one embodiment of the present invention is to provide a novel semiconductor device. Another object of one embodiment of the present invention is to provide a semiconductor device capable of reducing its area. Another object of one embodiment of the present invention is to provide a semiconductor device capable of reducing power consumption. Another object of one embodiment of the present invention is to provide a semiconductor device capable of operating at high speed.

One embodiment of the present invention does not necessarily achieve all the objects listed above and only needs to achieve at least one of the objects. The description of the above objects does not disturb the existence of other objects. Other objects will be apparent from and can be derived from the description of the specification, the drawings, the claims, and the like.

A semiconductor device of one embodiment of the present invention includes a first circuit, a second circuit, and an insulating layer. The first circuit includes a memory circuit. The second circuit includes an amplifier circuit. The insulating layer is provided between the first circuit and the second circuit. The memory circuit includes a first transistor including a first channel formation region. The amplifier circuit includes a second transistor including a second channel formation region. The first channel formation region includes a single crystal semiconductor. The second channel formation region includes an oxide semiconductor. The first circuit and the second circuit have mutually overlapping regions.

In the semiconductor device, the first channel formation region and the second channel formation region may have mutually overlapping regions.

In the semiconductor device, one of a source and a drain of the first transistor may be electrically connected to one of a source and a drain of the second transistor.

A semiconductor device of another embodiment of the present invention includes a first circuit, a second circuit, a third circuit, and an insulating layer. The first circuit includes an integrated circuit. The second circuit includes a memory circuit. The third circuit includes an amplifier circuit. The insulating layer is provided between the first circuit and the second and the third circuits. The integrated circuit includes a first transistor including a first channel formation region. The memory circuit includes a second transistor including a second channel formation region. The amplifier circuit includes a third transistor including a third channel formation region. The first channel formation region includes a single crystal semiconductor. The second channel formation region includes an oxide semiconductor. The third channel formation region includes an oxide semiconductor. The first circuit and the second circuit or the third circuit have mutually overlapping regions.

In the semiconductor device, the first channel formation region and the second channel formation region or the third channel formation region may have mutually overlapping regions.

In the semiconductor device, one of a source and a drain of the first transistor may be electrically connected to one of a source and a drain of the third transistor.

In the semiconductor device, the oxide semiconductor may contain In, Zn, and M (M is Al, Ti, Ga, Y, Zr, La, Ce, Nd, or Hf).

According to one embodiment of the present invention, a novel semiconductor device can be provided. Alternatively, according to one embodiment of the present invention, a semiconductor device capable of reducing its area can be provided. Further alternatively, according to one embodiment of the present invention, a semiconductor device capable of reducing power consumption can be provided. Further alternatively, according to one embodiment of the present invention, a semiconductor device capable of operating at high speed can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

DETAILED DESCRIPTION OF THE INVENTION

Figure 1A:
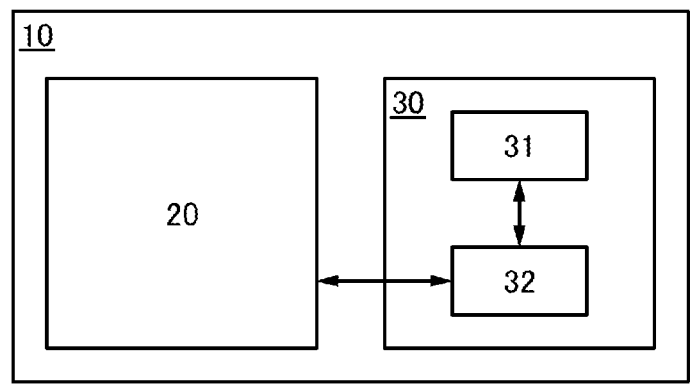
FIGS. 1A to 1C illustrate examples of a structure of a semiconductor device.

Hereinafter, embodiments of the present invention will be described below in detail with reference to the accompanying drawings. Note that the present invention is not limited to the following description and it is easily understood by those skilled in the art that the mode and details can be variously changed without departing from the spirit and scope of the present invention. Therefore, the present invention should not be interpreted as being limited to the description of Embodiment below.

One embodiment of the present invention includes, in its category, devices including an integrated circuit, a display device, and an RF tag. Further, the display device includes, in its category, a display device in which an integrated circuit is included in a circuit, such as a liquid crystal display device, a light-emitting device in which a light-emitting element typified by an organic light-emitting element is provided in each pixel, an electronic paper, a digital micromirror device (DMD), a plasma display panel (PDP), a field emission display (FED), and the like.

In describing structures of the present invention with reference to the drawings, common reference numerals are used for the same portions in different drawings.

Note that in this specification and the like, part of a diagram or a text described in one embodiment can be taken out to constitute one embodiment of the invention. Thus, in the case where a diagram or a text related to a certain portion is described, the context taken out from part of the diagram or the text is also disclosed as one embodiment of the invention, and one embodiment of the invention can be constituted. The embodiment of the present invention is clear. Therefore, for example, in a diagram or text in which one or more active elements (e.g., transistors), wirings, passive elements (e.g., capacitors), conductive layers, insulating layers, semiconductor layers, components, devices, operating methods, manufacturing methods, or the like are described, part of the diagram or the text is taken out, and one embodiment of the invention can be constituted. For example, from a circuit diagram in which N circuit elements (e.g., transistors or capacitors; N is an integer) are provided, it is possible to constitute one embodiment of the invention by taking out M circuit elements (e.g., transistors or capacitors; M is an integer, where M<N). For another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

Note that in the case where at least one specific example is described in a diagram or text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted. The embodiment of the present invention is clear.

Note that in this specification and the like, a content described in at least a diagram (or may be part of the diagram) is disclosed as one embodiment of the invention, and one embodiment of the invention can be constituted. Therefore, when a certain content is described in a diagram, the content is disclosed as one embodiment of the invention even when the content is not described with a text, and one embodiment of the invention can be constituted. In a similar manner, part of a diagram, which is taken out from the diagram, is disclosed as one embodiment of the invention, and one embodiment of the invention can be constituted. The embodiment of the present invention is clear.

Embodiment 1

In this embodiment, a structure example of one embodiment of the present invention is described.

FIG. 1A illustrates an example of a structure of a semiconductor device 10 of one embodiment of the present invention. The semiconductor device 10 includes a circuit 20 and a circuit 30.

The circuit 20 has functions of performing arithmetic operations, controlling other circuits, and the like. The circuit 20 includes an integrated circuit which includes a plurality of transistors. Furthermore, the circuit 20 includes a variety of logic circuits such as a sequential circuit and a combinational circuit. For example, the circuit 20 can be used as a central processing unit (CPU).

The circuit 30 has a function of storing data input from the circuit 20, an input/output device (not shown), and the like. Further, the circuit 30 has a function of outputting the data stored in the circuit 30 to the circuit 20, the input/output device, and the like. The circuit 30 can be used as any of memory devices such as a cache memory, a main memory device, and an auxiliary memory device.

The circuit 30 includes a circuit 31 and a circuit 32. The circuit 31 has a function of storing data. Note that the circuit 31 includes a cell array which has a plurality of circuits having a function of storing data (hereinafter also referred to as memory circuits). The circuit 31 includes a volatile memory such as a DRAM or an SRAM, or a nonvolatile memory such as a NAND flash memory. The circuit 31 preferably includes a DRAM because high-speed operation and small area of the circuit 31 can be achieved. Note that the circuit 30 may include a driver circuit for controlling the operation of the circuit 31.

The circuit 32 includes a circuit which has a function of amplifying an input signal and outputting the amplified signal (hereinafter also referred to as an amplifier circuit). Specifically, the amplifier circuit has a function of amplifying data input from the outside and writing the amplified data to the circuit 31 and a function of amplifying the data stored in the circuit 31 and outputting the amplified data. Thus, even in the case where the signal input from the outside is extremely weak, the signal can be amplified and written to the memory circuits. Further, even in the case where the signal stored in the circuit 31 is extremely weak, the signal can be amplified and read out. Accordingly, writing and reading of data can be performed accurately. The circuit 32 may include a plurality of sense amplifiers. Note that the circuit 30 may include a driver circuit for controlling operation of the circuit 32.

Figure 1B:
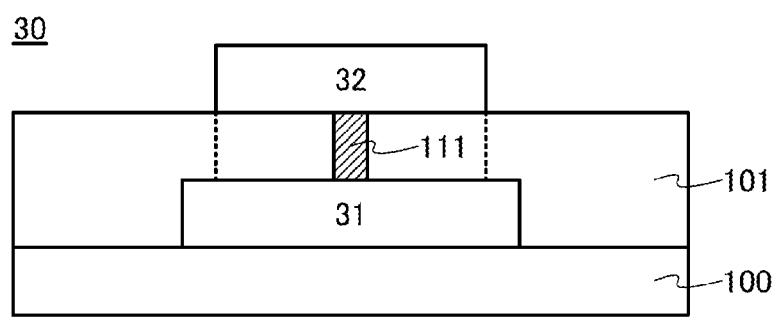

FIG. 1B illustrates an example of a cross-sectional structure of the circuit 30. The circuit 30 includes the circuit 31 over a substrate 100, an insulating layer 101 over the circuit 31, and a circuit 32 over the insulating layer 101. The insulating layer 101 has an opening and a conductive layer 111 is provided in the opening. The circuit 32 is connected to the circuit 31 through the conductive layer 111. As described above, the circuit 30 has a structure in which the circuit 31 and the circuit 32 are stacked. Note that the circuit 20 may be provided over the substrate 100.

Note that in this specification and the like, when it is explicitly described that X and Y are connected, the case where X and Y are electrically connected, the case where X and Y are functionally connected, and the case where X and Y are directly connected are included therein. Accordingly, another element may be interposed between elements having a connection relation shown in drawings and texts, without limiting to a predetermined connection relation, for example, the connection relation shown in the drawings and the texts. Here, X and Y each denote an object (e.g., a device, an element, a circuit, a line, an electrode, a terminal, a conductive film, a layer, or the like).

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. Note that, for example, in the case where a signal output from X is transmitted to Y even when another circuit is interposed between X and Y, X and Y are functionally connected.

Note that when it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, when it is explicitly described that "X and Y are electrically connected", the description is the same as the case where it is explicitly only described that "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X the source (or the first terminal or the like) of the transistor, the drain (or the second terminal or the like) of the transistor, and Y are electrically connected to each other in this order"; "a source (or a first terminal or the like) of a transistor is electrically connected to X a drain (or a second terminal or the like) of the transistor is electrically connected to Y, and X the source (or the first terminal or the like) of the transistor, the drain (or the second terminal or the like) of the transistor, and Y are electrically connected to each other in this order"; and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that one embodiment of the present invention is not limited to these expressions which are just examples. Here, each of X, Y, Z1, and Z2 denotes an object (e.g., a device, an element, a circuit, a wiring, an electrode, a terminal, a conductive film, a layer, or the like).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

In FIG. 1B, the circuit 31 can be provided so as to have a region overlapping with the circuit 32 with the insulating layer 101 provided therebetween. Furthermore, the circuit 31 can be provided so as to overlap with an entire surface of the circuit 32 with the insulating layer 101 provided therebetween. By employing either of the above structures, the circuit 32 can be provided while an increase in the area of the circuit 30 is suppressed. That is, the amplifier circuit can be mounted on the circuit 30 while the increase in the area of the circuit 30 is suppressed. Thus, the area of the semiconductor device 10 can be reduced.

Figure 1C:
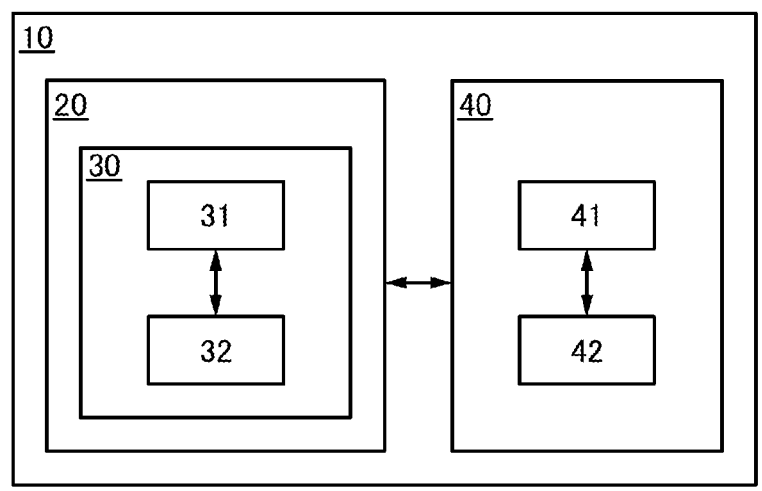

As shown in FIG. 1C, the circuit 30 may be provided in the circuit 20. In this case, the circuit 30 can be used as a cache memory, for example. Furthermore, in FIG. 1C, the semiconductor device 10 may further include a circuit 40. The circuit 40 includes a circuit 41 and a circuit 42. The circuits 41 and 42 have functions similar to those of the circuits 31 and 32, respectively. The circuits 41 and 42 can be stacked in a manner similar to the circuits 31 and 32 (see FIG. 1B). The circuit 40 can be used as a main memory device, for example.

Figure 2A:
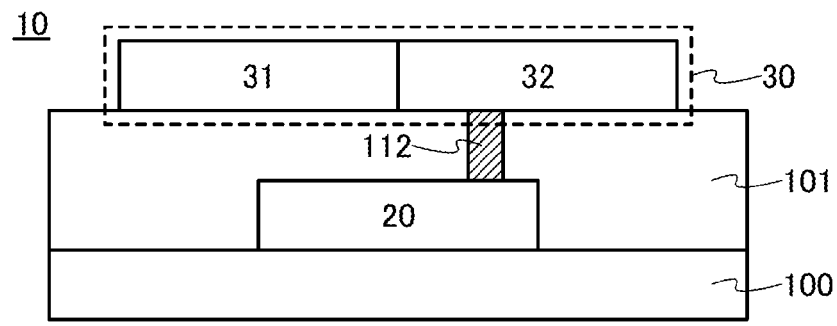
FIGS. 2A to 2C illustrate examples of a structure of a semiconductor device.
Figure 2B:
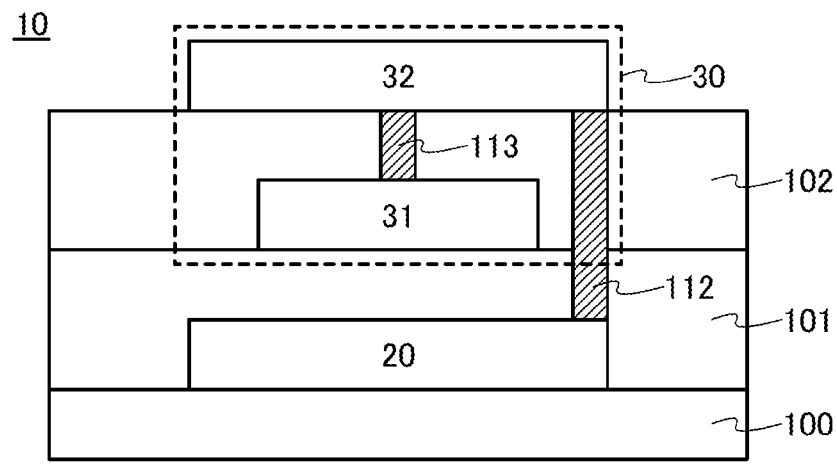
Figure 2C:
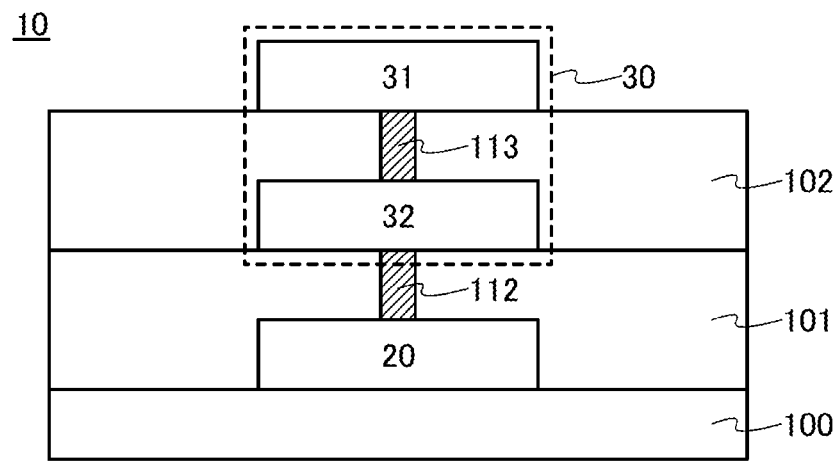

Furthermore, as shown in FIGS. 2A to 2C, the semiconductor device 10 may have a structure in which the circuit 30 is stacked over the circuit 20. In FIG. 2A, the semiconductor device 10 includes the circuit 20 over the substrate 100, the insulating layer 101 over the circuit 20, and the circuits 31 and 32 over the insulating layer 101. The insulating layer 101 has an opening and a conductive layer 112 is provided in the opening. The circuit 32 is connected to the circuit 20 through the conductive layer 112. The circuit 32 is connected to the circuit 31. As described above, the semiconductor device 10 has a structure in which the circuit 20 and the circuits 31 and 32 are stacked.

The circuit 31 can be provided so as to have a region overlapping with the circuit 20. The circuit 32 can be provided so as to have a region overlapping with the circuit 20. Furthermore, the circuit 31 can be provided so as to have a region overlapping with an entire surface of the circuit 20. Furthermore, the circuit 32 can be provided so as to have a region overlapping with the entire surface of the circuit 20. By employing any of the structures, the circuit 32 can be provided while an increase in the area of the semiconductor device 10 is suppressed. That is, the amplifier circuit can be mounted on the circuit 30 while the increase in the area of the semiconductor device 10 is suppressed. Thus, the area of the semiconductor device 10 can be reduced.

As shown in FIG. 2B, the circuits 31 and 32 can be stacked. In FIG. 2B, the semiconductor device 10 includes the circuit 20 over the substrate 100, the insulating layer 101 over the circuit 20, the circuit 31 over the insulating layer 101, the insulating layer 102 over the circuit 31, and the circuit 32 over the insulating layer 102. The insulating layers 101 and 102 have a first opening and the conductive layer 112 is provided in the first opening. The circuit 32 is connected to the circuit 20 through the conductive layer 112. Further, the insulating layer 102 has a second opening and a conductive layer 113 is provided in the second opening. The circuit 32 is connected to the circuit 31 through the conductive layer 113.

The circuit 31 can be provided so as to have a region overlapping with the circuit 20. Furthermore, the circuit 31 can be provided so as to have a region overlapping with an entire surface of the circuit 20. The circuit 32 can be provided so as to have a region overlapping with the circuit 20. Furthermore, the circuit 32 can be provided so as to have a region overlapping with the entire surface of the circuit 20. The circuit 31 can be provided so as to have a region overlapping with the circuit 32. Furthermore, the circuit 31 can be provided so as to have a region overlapping with an entire surface of the circuit 32. By employing any of the above structures, the circuit 32 can be provided while the increase in the area of the semiconductor device 10 is suppressed. That is, the amplifier circuit can be mounted on the circuit 30 while the increase in the area of the semiconductor device 10 is suppressed. Thus, the area of the semiconductor device 10 can be reduced.

In FIG. 2B, the circuit 32 is provided over the circuit 31; however, the circuit 31 may be provided over the circuit 32 as shown in FIG. 2C. Here, the insulating layer 101 has an opening, and the conductive layer 112 is provided in the opening of the insulating layer 101. The circuit 32 is connected to the circuit 20 through the conductive layer 112. Further, the insulating layer 102 has an opening, and the conductive layer 113 is provided in the opening of the insulating layer 102. The circuit 32 is connected to the circuit 31 through the conductive layer 113.

The circuit 31 can be provided so as to have a region overlapping with the circuit 32. Furthermore, the circuit 31 can be provided so as to have a region overlapping with the entire surface of the circuit 32. By employing any of the above structures, the area of the semiconductor device 10 can be reduced.

Next, specific structural examples of the semiconductor device 10 are described with reference to FIGS. 3A and 3B.

Figure 3A:
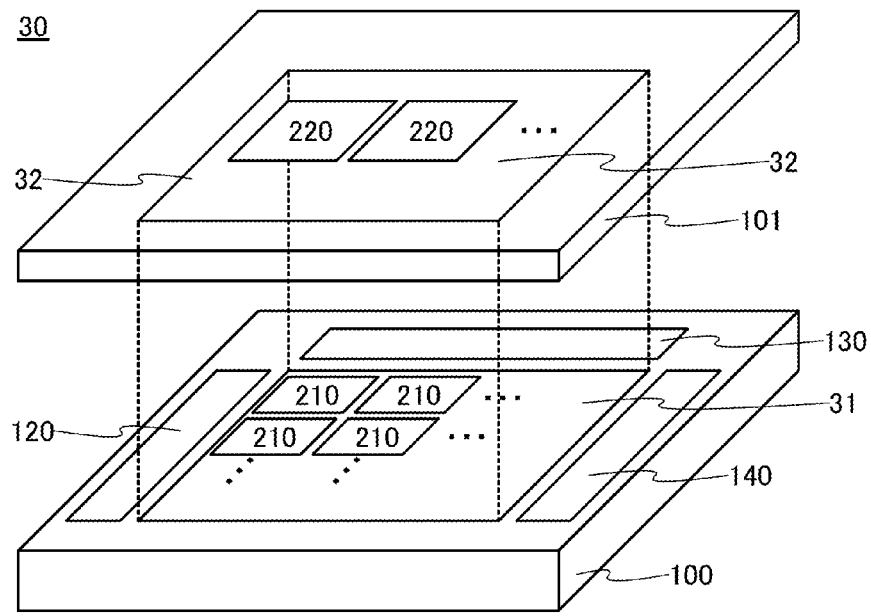
FIGS. 3A and 3B illustrate examples of a structure of a semiconductor device.

FIG. 3A is a perspective view illustrating an example of the structure of the circuit 30 in FIGS. 1A to 1C. The circuit 30 includes the circuit 31 and circuits 120, 130, and 140 which are formed over the substrate 100, the insulating layer 101 which is formed over the circuits 31, 120, 130, and 140, and the circuit 32 which is formed over the insulating layer 101. Although not shown, the circuit 32 is connected to the circuit 31 through the conductive layer. Note that the circuit 20 (see FIGS. 1A and 1C) may be provided over the substrate 100.

The circuit 31 includes a plurality of circuits 210. Each circuit 210 has a function of storing data (hereinafter referred to as a memory circuit 210). The circuit 210 includes a volatile memory such as a DRAM or an SRAM, or a nonvolatile memory such as a NAND flash memory. The memory circuit 210 preferably includes a DRAM because high-speed operation and small area of the circuit 31 can be achieved.

The circuit 32 includes a plurality of circuits 220. Each circuit 220 has a function of amplifying an input signal and outputting the amplified signal (hereinafter also referred to as an amplifier circuit 220). Although not shown in this figure, a plurality of amplifier circuits 220 are each connected to any of the plurality of memory circuits 210. The amplifier circuits 220 have a function of amplifying data input from the outside (from the circuit 20, the input/output device, and the like) and writing the amplified data to the memory circuits 210. Further, the amplifier circuits 220 have a function of amplifying the data stored in the memory circuits 210 and outputting the amplified data to the outside.

The circuit 120 is a driver circuit which has a function of supplying a signal for selecting a specific memory circuit 210 from the plurality of memory circuits 210. The circuit 130 is a driver circuit which has a function of controlling data writing to the memory circuits 210 and data reading from the memory circuits 210. Note that the circuit 130 may have a function of supplying (precharging) a predetermined potential to wirings connected to the memory circuits 210. The circuit 140 is a driver circuit which has a function of supplying a signal for controlling the amplifier circuits 220.

Here, the substrate 100 can be a substrate including a single crystal semiconductor. As this substrate, a single crystal silicon substrate, a single crystal germanium substrate, or the like can be used. The memory circuit 210 and the circuits 120, 130, and 140 can be formed using transistors whose channel formation regions are formed in part of the substrate 100. Thus, the memory circuit 210 and the circuits 120, 130, and 140 can be formed using transistors each including a single crystal semiconductor in its channel formation region. The memory circuits 210 and the circuits 120, 130, and 140 are formed using such transistors; thus, operation speed of these circuits can be improved.

Meanwhile, the amplifier circuits 220 can be formed using transistors whose channel formation regions are formed in a semiconductor film. For example, the amplifier circuits 220 can be formed using transistors each including a non-single-crystal semiconductor in a channel formation region. As the non-single-crystal semiconductor, non-single-crystal silicon such as amorphous silicon, microcrystalline silicon or polycrystalline silicon, non-single-crystal germanium such as amorphous germanium, microcrystalline germanium or polycrystalline germanium, or the like can be used. Alternatively, the amplifier circuits 220 can be formed using transistors each including an oxide semiconductor in its channel formation region (hereinafter also referred to as an OS transistor).

Such a transistor whose channel formation region is formed in a semiconductor film can be formed over the insulating layer 101; thus, the amplifier circuits 220 can be formed over the insulating layer 101. Accordingly, as shown in FIG. 3A, the insulating layer 101 can be provided over the plurality of memory circuits 210, and the plurality of amplifier circuits 220 can be formed over the insulating layer 101. That is, a structure in which the amplifier circuits 220 are stacked over the memory circuits 210 can be obtained. Consequently, the area of the circuit 30 can be reduced.

In particular, the amplifier circuits 220 are preferably formed using OS transistors. An oxide semiconductor has a wider band gap and lower intrinsic carrier density than silicon and the like. Thus, an off-state current of an OS transistor is extremely small. Therefore, the amplifier circuits 220 which have low off-state current and low power consumption can be realized by using the OS transistors for the amplifier circuits 220.

Furthermore, miniaturization of the OS transistor leads to high-speed operation. Therefore, when the OS transistor is used for the amplifier circuit 220, operation speed of the amplifier circuit 220 can be improved. For example, the operation speed of the amplifier circuits 220 can be less than or equal to 10 ns, preferably less than or equal to 5 ns, further preferably less than or equal to 1 ns. The channel length of the OS transistor can be less than or equal to 100 nm, preferably less than or equal to 60 nm, further preferably less than or equal to 40 nm, even further preferably less than or equal to 30 nm.

Here, any of the plurality of amplifier circuits 220 can be provided so as to have a region overlapping with any of the plurality of memory circuits 210. Furthermore, any of the plurality of amplifier circuits 220 can be provided so as to have a region overlapping with an entire surface of any of the plurality of memory circuits 210. All of the plurality of amplifier circuits 220 can be provided so as to have regions overlapping with any of the plurality of memory circuits 210. Furthermore, all of the plurality of amplifier circuits 220 can be provided so as to have regions overlapping with an entire surface of any of the plurality of memory circuits 210. With any of the above-described structures, the circuit 32 can be provided while the increase in the area of the circuit 30 is suppressed. That is, the amplifier circuit can be mounted on the circuit 30 while the increase in the area of the circuit 30 is suppressed. Thus, the area of the semiconductor device 10 can be reduced. Note that the amplifier circuits 220 can be provided so as to have regions overlapping with the circuit 120, the circuit 130, or the circuit 140.

Here, the circuits 120, 130, and 140 are provided over the substrate 100; however, the circuits 120, 130, and 140 may be provided over the insulating layer 101. In that case, preferably, the circuits 120, 130, and 140 are each formed using a transistor whose channel formation region is formed in a semiconductor film. Further, an OS transistor capable of operating at high speed is preferably used for the transistor.

Figure 3B:
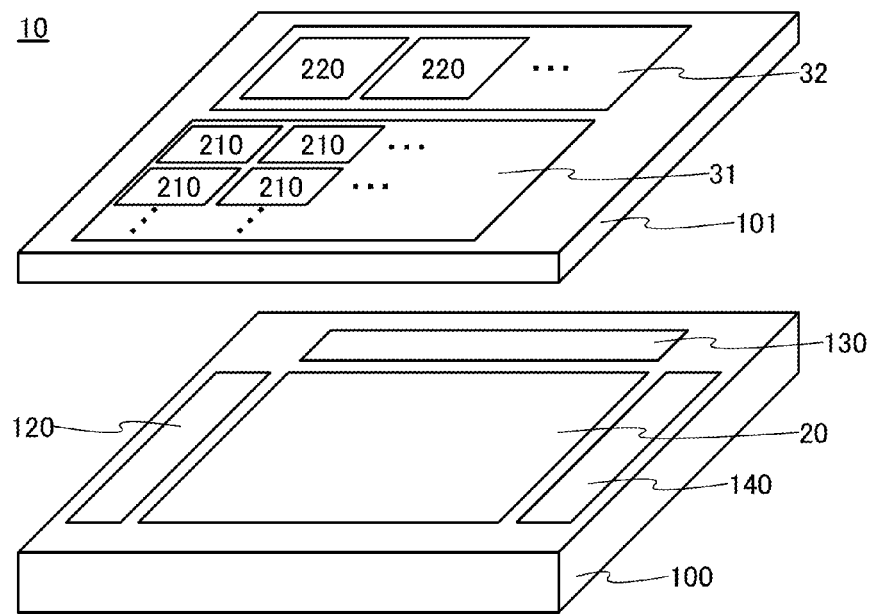

FIG. 3B is a perspective view illustrating an example of the structure of the semiconductor device 10 in FIG. 2A. The semiconductor device 10 includes the circuits 20, 120, 130, and 140 which are formed over the substrate 100, the insulating layer 101 which is formed over the circuits 20, 120, 130, and 140, and the circuits 31 and 32 which are formed over the insulating layer 101. Here, the circuit 32 is connected to the circuits 20 and 31. Further, each of the plurality of amplifier circuits 220 is connected to any of the plurality of memory circuits 210.

As described above, the circuit 20 is provided over the substrate 100, and the circuits 31 and 32 are provided over the insulating layer 101. That is, the circuit 20 and the circuits 31 and 32 can be stacked. Accordingly, the area of the semiconductor device 10 can be reduced. In this case, the transistors included in the plurality of memory circuits 210 that are provided in the circuit 31 and the transistors included in the plurality of amplifier circuits 220 that are provided in the circuit 32 are preferably transistors whose channel formation regions are formed in a semiconductor film. For the transistors, OS transistors which have low off-state current and are capable of operating at high speed are preferably used.

The circuit 20 includes an integrated circuit which includes a plurality of transistors. The transistors are transistors whose channel formation regions are formed in part of the substrate 100. That is, the circuit 20 can be formed using an integrated circuit which includes transistors including a single crystal semiconductor in their channel formation regions. Thus, operation speed of the circuit 20 can be improved.

Any of the plurality of memory circuits 210 can be provided so as to have a region overlapping with the circuit 20. Alternatively, all of the plurality of memory circuits 210 can be provided so as to have regions overlapping with the circuit 20. Any of the plurality of amplifier circuits 220 can be provided so as to have a region overlapping with the circuit 20. Alternatively, all of the plurality of memory circuits 220 can be provided so as to have regions overlapping with the circuit 20. With any of the above structures, the circuits 31 and 32 can be provided while the increase in the area of the semiconductor device 10 is suppressed. That is, the memory circuit and the amplifier circuit can be mounted on the semiconductor device 10 while the increase in the area of the semiconductor device 10 is suppressed. Thus, the area of the semiconductor device 10 can be reduced. Note that any of the memory circuits 210 can be provided so as to have a region overlapping with the circuit 120, the circuit 130, or the circuit 140. In addition, any of the amplifier circuits 220 can be provided so as to have a region overlapping with the circuit 120, the circuit 130, or the circuit 140.

Here, the circuits 120, 130, and 140 are provided over the substrate 100; however, the circuits 120, 130, and 140 may be provided over the insulating layer 101. In that case, preferably, the circuits 120, 130, and 140 are each formed using a transistor whose channel formation region is formed in a semiconductor film. Further, an OS transistor capable of operating at high speed is preferably used for the transistor.

Figure 4:
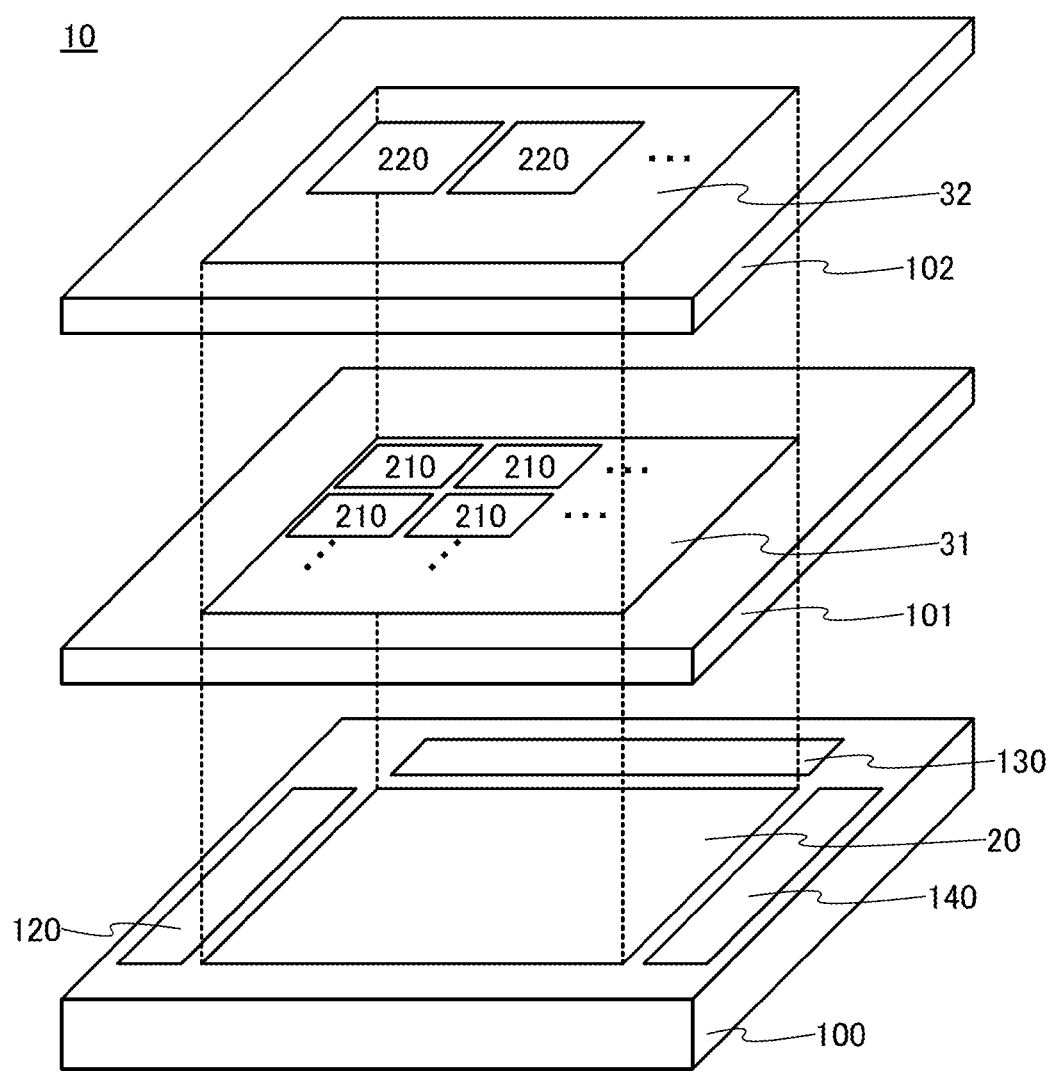
FIG. 4 illustrates an example of a structure of a semiconductor device.

In FIG. 3B, the circuits 31 and 32 are formed in the same layer; however, the circuits 31 and 32 may be stacked as shown in FIG. 4. The semiconductor device 10 in FIG. 4 includes the circuit 20, 120, 130, and 140 which are formed over the substrate 100, the insulating layer 101 which is formed over the circuits 20, 120, 130, and 140, the circuit 31 which is formed over the insulating layer 101, the insulating layer 102 which is formed over the circuit 31, and the circuit 32 which is formed over the insulating layer 102. Here, the circuit 32 is connected to the circuits 20 and 31.

Any of the plurality of amplifier circuits 220 can be provided so as to have a region overlapping with any of the plurality of memory circuits 210. Furthermore, any of the plurality of amplifier circuits 220 can be provided so as to have a region overlapping with an entire surface of any of the plurality of memory circuits 210. All of the plurality of amplifier circuits 220 can be provided so as to have regions overlapping with any of the plurality of memory circuits 210. Furthermore, all of the plurality of amplifier circuits 220 can be provided so as to have regions overlapping with an entire surface of any of the plurality of memory circuits 210. With any of the above structures, the circuits 31 and 32 can be provided while the increase in the area of the semiconductor device 10 is suppressed. That is, the memory circuits and the amplifier circuits can be mounted on the semiconductor device 10 while the increase in the area of the semiconductor device 10 is suppressed. Thus, the area of the semiconductor device 10 can be reduced. Note that any of the memory circuits 210 can be provided so as to have a region overlapping with the circuit 120, the circuit 130, or the circuit 140. In addition, any of the amplifier circuits 220 can be provided so as to have a region overlapping with the circuit 120, the circuit 130, or the circuit 140.

Here, the circuits 120, 130, and 140 are provided over the substrate 100; however, the circuits 120, 130, and 140 may be provided over the insulating layer 101 or 102. In that case, preferably, the circuits 120, 130, and 140 are each formed using a transistor whose channel formation region is formed in a semiconductor film. Further, an OS transistor capable of operating at high speed is preferably used for the transistor.

In FIG. 4, the circuit 32 is provided over the circuit 31; however, the circuit 31 may be provided over the circuit 32. In this case, the semiconductor device 10 includes the circuit 32 over the insulating layer 102, the insulating layer 101 over the circuit 32, and the circuit 31 over the insulating layer 101.

As described above, in one embodiment of the present invention, a semiconductor device in which the circuit 31 including the memory circuits and the circuit 32 including the amplifier circuits are stacked or in which the circuit 20 and the circuit 31 or 32 are stacked can be obtained. Thus, the memory circuits and the amplifier circuits can be mounted on the semiconductor device 10 while the increase in the area of the semiconductor device 10 is suppressed. Therefore, the area of the semiconductor device 10 can be reduced.

Further, the use of OS transistors for forming the circuits enables the memory circuits and the amplifier circuits to have low off-state current and operate at high speed. Thus, a reduction in power consumption and improvement in operation speed of the semiconductor device 10 can be achieved.

This embodiment can be combined with any other embodiment as appropriate. Note that a content (or may be part of the content) described in one embodiment may be applied to, combined with, or replaced by a different content (or may be part of the different content) described in the same embodiment and/or a content (or may be part of the content) described in one or a plurality of different embodiments. Note that in each embodiment, a content described in the embodiment is a content described with reference to a variety of diagrams or a content described with a text described in this specification. In addition, by combining a diagram (or part thereof) described in one embodiment with another part of the diagram, a different diagram (or part thereof) described in the same embodiment, and/or a diagram (or part thereof) described in another or other embodiments, much more diagrams can be formed. The same can be applied to any other embodiment Embodiment 2

In this embodiment, a specific structural example of the structure of one embodiment of the present invention is described.

Figure 5:
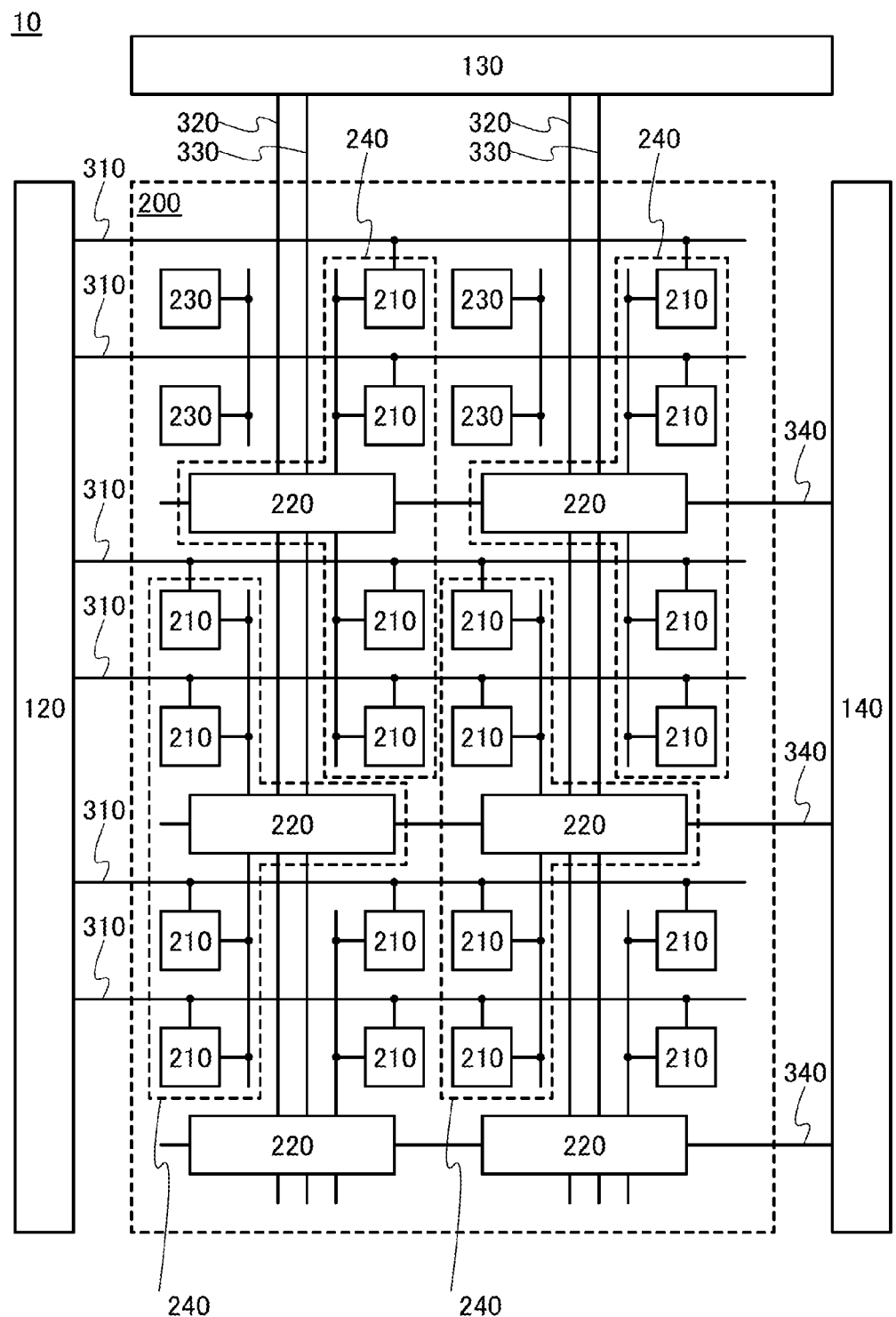
FIG. 5 illustrates an example of a structure of a semiconductor device.

FIG. 5 illustrates an example of a structure of a semiconductor device 10. The semiconductor device 10 includes circuits 120, 130, 140 and 200. The circuit 200 includes a plurality of memory circuits 210 and a plurality of amplifier circuits 220. Note that the circuit 200 corresponds to the circuit including the circuits 31 and 32 shown in FIGS. 1A to 1C, FIGS. 2A and 2B, FIGS. 3A and 3B and FIG. 4.

The circuit 120 is connected to the plurality of memory circuits 210 through a plurality of wirings 310. The circuit 120 is a driver circuit which has a function of supplying the wirings 310 with a signal for selecting memory circuits 210 in a specific row from the plurality of memory circuits 210.

The circuit 130 is connected to the plurality of amplifier circuits 220 through a plurality of wirings 320 or a plurality of wirings 330. The circuit 130 is a driver circuit which has a function of supplying the wirings 320 or the wirings 330 with a potential corresponding to data to be written to the memory circuits 210 and a function of reading out the data stored in the memory circuits 210 from the potential of the wirings 320 or the wirings 330. Further, the circuit 130 may have a function of supplying (precharging) the wirings 320 or the wirings 330 with a predetermined potential.

The circuit 140 is connected to the plurality of amplifier circuits 220 through a plurality of wirings 340. The circuit 140 is a driver circuit that has a function of supplying a control signal to the amplifier circuits 220 through the wirings 340. Note that each of the wirings 340 may be formed of a plurality of different kinds of wirings. In that case, the plurality of wirings 340 can be supplied with different signals. Accordingly, the circuit 140 can supply a plurality of different signals to the same amplifier circuit 220 at the same time.

In the circuit 200, memory circuits 210 in the same row are connected to the same wiring 310. Further, predetermined memory circuits 210 in the same column are connected to the same amplifier circuit 220. Note that four memory circuits 210 in the same column are connected to the same amplifier circuit 220 in the drawing; however, the structure is not limited to this example. That is, an arbitrary number (one or more) of memory circuits 210 may be connected to the same amplifier circuit 220.

Each amplifier circuit 220 is connected to the plurality of memory circuits 210. The amplifier circuit 220 has a function of amplifying a potential that is supplied from the circuit 130 to the wiring 320 or the wiring 330 and writing the amplified potential to the memory circuit 210. Further, the amplifier circuit 220 has a function of amplifying data that is stored in the memory circuits 210 and outputting the amplified data to the circuit 130.

As described above, the circuit 200 includes a plurality of circuits 240 each of which includes one amplifier circuit 220 and a plurality of memory circuits 210 (four memory circuits 210 in FIG. 5) connected to the amplifier circuit 220.

Note that for convenience of description, the plurality of memory circuits 210 do not overlap with the plurality of amplifier circuits 220 in the circuit 200 in FIG. 5; however, the plurality of memory circuits 210 and the plurality of amplifier circuits 220 are actually stacked as shown in FIGS. 3A and 3B and FIG. 4.

The circuit 200 may include a circuit 230. The circuit 230 can be formed in the same process as that of the memory circuits 210, and can have the same structure as the circuit 210. The circuit 230 is not connected to the amplifier circuits 220, and is a dummy circuit in which data writing and data reading are not performed. By provision of the circuit 230 in a region where the memory circuits 210 are not formed, planarity of the insulating layer 101 (see FIGS. 3A and 3B and FIG. 4) formed over the circuits 210 and the circuit 230 can be improved. Note that in the case where the circuit 200 includes a plurality of circuits 230, the circuits 230 may be connected to each other with a wiring.

Note that the amplifier circuits 220 may be provided so as to have regions overlapping with the circuits 230. Thus, the area of the circuit 200 can be reduced.

Figure 6:
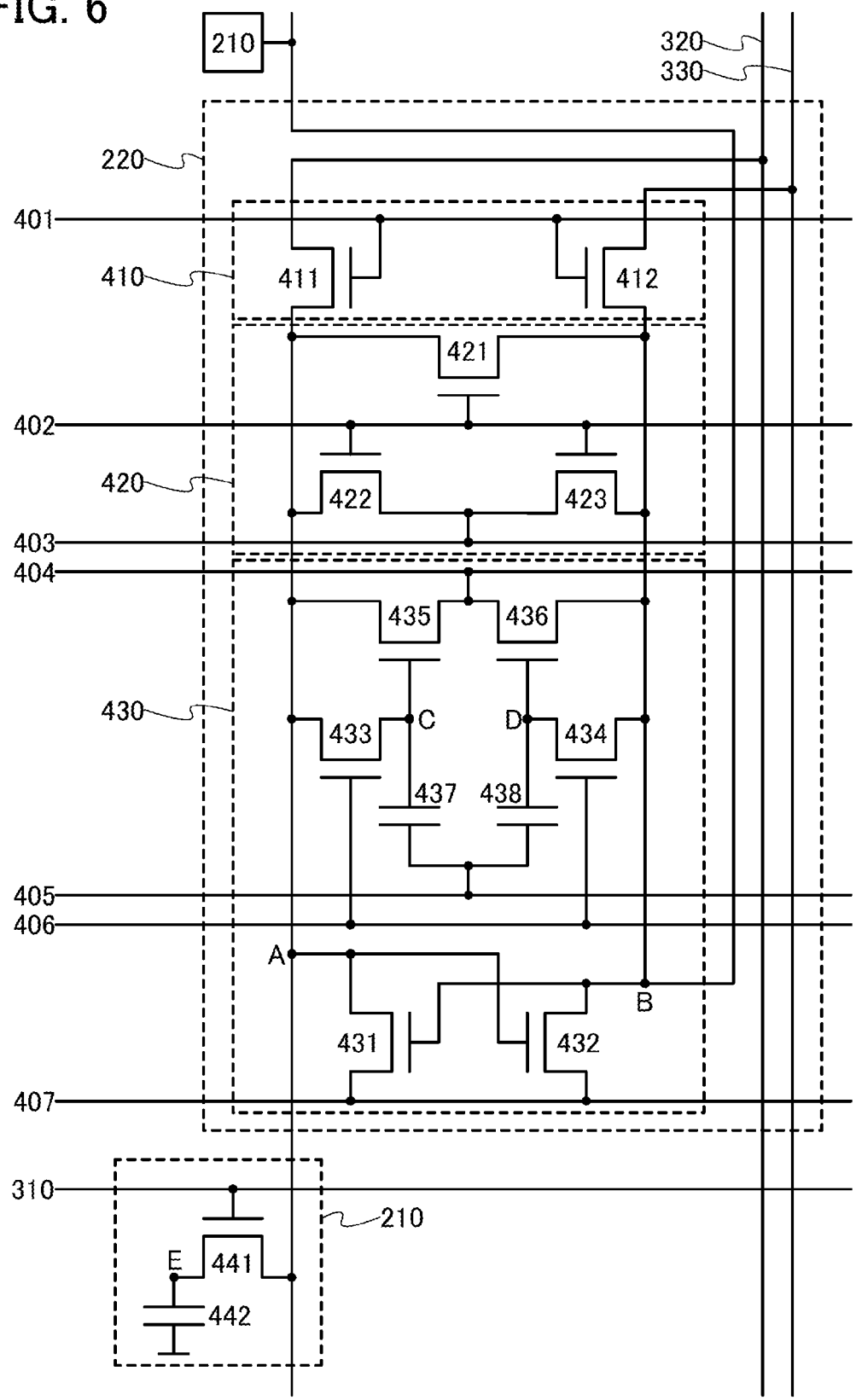
FIG. 6 is a circuit diagram illustrating an example of a structure of a semiconductor device.

Next, a specific structural example of the amplifier circuit 220 and the memory circuits 210 connected to the amplifier circuit 220 is shown in FIG. 6.

The amplifier circuit 220 includes circuits 410, 420 and 430. The circuit 410 has a function as a selection circuit that controls selection/non-selection of the amplifier circuit 220. The circuit 420 has a function as a precharge circuit that precharges a node A and a node B. The circuit 430 has a function as an amplifier circuit that amplifies the potentials of the node A and the node B.

The circuit 410 includes transistors 411 and 412. A gate of the transistor 411 is connected to a wiring 401, one of a source and a drain thereof is connected to the wiring 320, and the other of the source and the drain thereof is connected to the node A. A gate of the transistor 412 is connected to the wiring 401, one of a source and a drain thereof is connected to the wiring 330, and the other of the source and the drain thereof is connected to the node B.

The potential of the wiring 401 is controlled so that the transistors 411 and 412 are turned on; thus, the amplifier circuit 220 can be selected.

The circuit 420 includes the transistors 421 to 423. A gate of the transistor 421 is connected to a wiring 402, one of a source and a drain thereof is connected to the node A, and the other of the source and the drain thereof is connected to the node B. A gate of the transistor 422 is connected to a wiring 402, one of a source and a drain thereof is connected to the node A, and the other of the source and the drain thereof is connected to a wiring 403. A gate of the transistor 423 is connected to the wiring 402, one of a source and a drain thereof is connected to the node B, and the other of the source and the drain thereof is connected to the wiring 403.

The potential of the wiring 402 is controlled so that the transistors 421 to 423 are turned on; thus, the node A and the node B can be precharged to the potential of the wiring 403.

The circuit 430 includes transistors 431 to 436 and capacitors 437 and 438. A gate of the transistor 431 is connected to the node B, one of a source and a drain thereof is connected to the node A, and the other of the source and the drain thereof is connected to a wiring 407. A gate of the transistor 432 is connected to the node A, one of a source and a drain thereof is connected to the node B, and the other of the source and the drain thereof is connected to the wiring 407. A gate of the transistor 433 is connected to a wiring 406, one of a source and a drain thereof is connected to the node A, and the other of the source and the drain thereof is connected to a node C. A gate of the transistor 434 is connected to the wiring 406, one of a source and a drain thereof is connected to the node B, and the other of the source and the drain thereof is connected to a node D. A gate of the transistor 435 is connected to the node C, one of a source and a drain thereof is connected to the node A, and the other of the source and the drain thereof is connected to a wiring 404. A gate of the transistor 436 is connected to the node D, one of a source and a drain thereof is connected to the node B, and the other of the source and the drain thereof is connected to the wiring 404. One electrode of the capacitor 437 is connected to the node C, and the other electrode of the capacitor 437 is connected to the wiring 405. One electrode of the capacitor 438 is connected to the node D, and the other electrode of the capacitor 438 is connected to the wiring 405.

The circuit 430 has a function of amplifying the potential of the node A and supplying the amplified potential to the memory circuit 210 or the wiring 320. Furthermore, the circuit 430 has a function of amplifying the potential of the node B and supplying the amplified potential to the memory circuit 210 or the wiring 330.

The memory circuit 210 has a transistor 441 and a capacitor 442. A gate of the transistor 441 is connected to the wiring 310, one of a source and a drain thereof is connected to the node A, and the other of the source and the drain thereof is connected to a node E. One electrode of the capacitor 442 is connected to the node E, and the other electrode of the capacitor 442 is connected to a wiring that has a function of supplying a predetermined potential. Note that the wiring that has a function of supplying a predetermined potential may be either a high power supply line or a low power supply line (e.g., a ground line). The predetermined potential may be a fixed potential or a varying potential, and is not limited to 0 V. As described above, a DRAM cell is formed in the memory circuit 210. Note that an SRAM cell or the like may be formed in the memory circuit 210.

In the memory circuit 210, the potential of the wiring 310 is controlled so that the transistor 441 is turned on; thus, the potential of the node A can be supplied to the node E (data writing). After that, the potential of the wiring 310 is controlled so that the transistor 441 is turned off; thus, the potential of the node E can be held (data holding). Then, with the node A in a floating state, the potential of the wiring 310 is controlled so that the transistor 441 is turned on; thus, the potential of the node E can be supplied to the node A (data reading).

Note that the wirings 401 to 407 correspond to the wirings 340 (see FIG. 5) including a plurality of wirings and are connected to the circuit 140. A control signal is supplied to each of the wirings 401 to 407 from the circuit 140.

In the above description, a "source" of a transistor means a source region that is part of a semiconductor film functioning as an active layer or a source electrode connected to the semiconductor film. Similarly, a "drain" of the transistor means a drain region that is part of the semiconductor film or a drain electrode connected to the semiconductor film. A "gate" means a gate electrode.

The terms "source" and "drain" of a transistor interchange with each other depending on the conductivity type of the transistor or levels of potentials applied to the terminals. In general, in an n-channel transistor, a terminal to which a lower potential is applied is called a source, and a terminal to which a higher potential is applied is called a drain. Further, in a p-channel transistor, a terminal to which a lower potential is applied is called a drain, and a terminal to which a higher potential is applied is called a source. In this specification, although connection relation of the transistor is described assuming that the source and the drain are fixed in some cases for convenience, actually, the names of the source and the drain interchange with each other depending on the relation of the potentials.

Preferably, the transistors 411, 412, 421 to 423 and 431 to 436 are each formed using a transistor whose channel formation region is formed in a semiconductor film. Accordingly, the amplifier circuit 220 can be stacked over the memory circuit 210 or the circuit 20 (see FIGS. 3A and 3B, and FIG. 4). Consequently, the area of the semiconductor device 10 can be reduced. Note that the material described in Embodiment 1 can be appropriately used as the material of semiconductor film.

Preferably, the transistors 411, 412, 421 to 423, and 431 to 436 are each an OS transistor. The OS transistor has extremely low off-state current. Thus, the use of the OS transistors as the transistors 411, 412, 421 to 423, and 431 to 436 enables leakage of electric charges to the node A and the node B to be reduced significantly when the transistors are off. Hence, an unintended potential change in the node A and the node B can be made extremely small.

Furthermore, miniaturization of the OS transistor leads to high-speed operation. Therefore, when the OS transistor is used for each of the transistors 411, 412, 421 to 423 and 431 to 436, operation speed of the amplifier circuit 220 can be improved. In this case, operation speed of the amplifier circuit 220 can be less than or equal to 10 ns, preferably less than or equal to 5 ns, further preferably less than or equal to 1 ns. The channel length of the OS transistor can be less than or equal to 100 nm, preferably less than or equal to 60 nm, further preferably less than or equal to 40 nm, even further preferably less than or equal to 30 nm.

The transistor 441 can be formed using a transistor including a single crystal semiconductor in a channel formation region. Specifically, the transistor 441 can be formed using a transistor whose channel formation region is formed in a substrate including a single crystal semiconductor. The memory circuit 210 is formed using such a transistor, so that operation speed of the memory circuit 210 can be improved.

Any of the materials described in Embodiment 1 can be appropriately used as the material of the single crystal semiconductor.

Furthermore, the transistor 441 can be formed using a transistor whose channel formation region is formed in a semiconductor film. Accordingly, the memory circuit 210 can be stacked over the circuit 20 and the amplifier circuit 220. Thus, the area of the semiconductor device 10 can be reduced. Any of the materials described in Embodiment 1 can be appropriately used for the material of the semiconductor film.

The transistor 441 can be an OS transistor. In this case, off-state current of the transistor 441 can be extremely low; thus, the potential of the node E can be held for a long time in a data holding period. Consequently, refresh operation in which writing is performed again at predetermined intervals becomes unnecessary or the frequency of the refresh operation can be extremely low.

Furthermore, miniaturization of the OS transistor leads to high-speed operation. Thus, by using the OS transistor as the transistor 441, operation speed of the memory circuit 210 can be improved. In this case, operation speed of the memory circuit 210 can be less than or equal to 10 ns, preferably less than or equal to 5 ns, further preferably less than or equal to 1 ns. The channel length of the OS transistor can be less than or equal to 100 nm, preferably less than or equal to 60 nm, further preferably less than or equal to 40 nm, even further preferably less than or equal to 30 nm.

Without limitation to the example in which the transistors 411, 412, 421 to 423, 431 to 436 and 441 are n-channel transistors shown in FIG. 6, each of the transistors 411, 412, 421 to 423, 431 to 436, and 441 may be either an n-channel transistor or a p-channel transistor.

Next, an example of operation of the amplifier circuit 220 and the memory circuit 210 shown in FIG. 6 is described.
<Reading from Memory Circuit>

Figure 7:
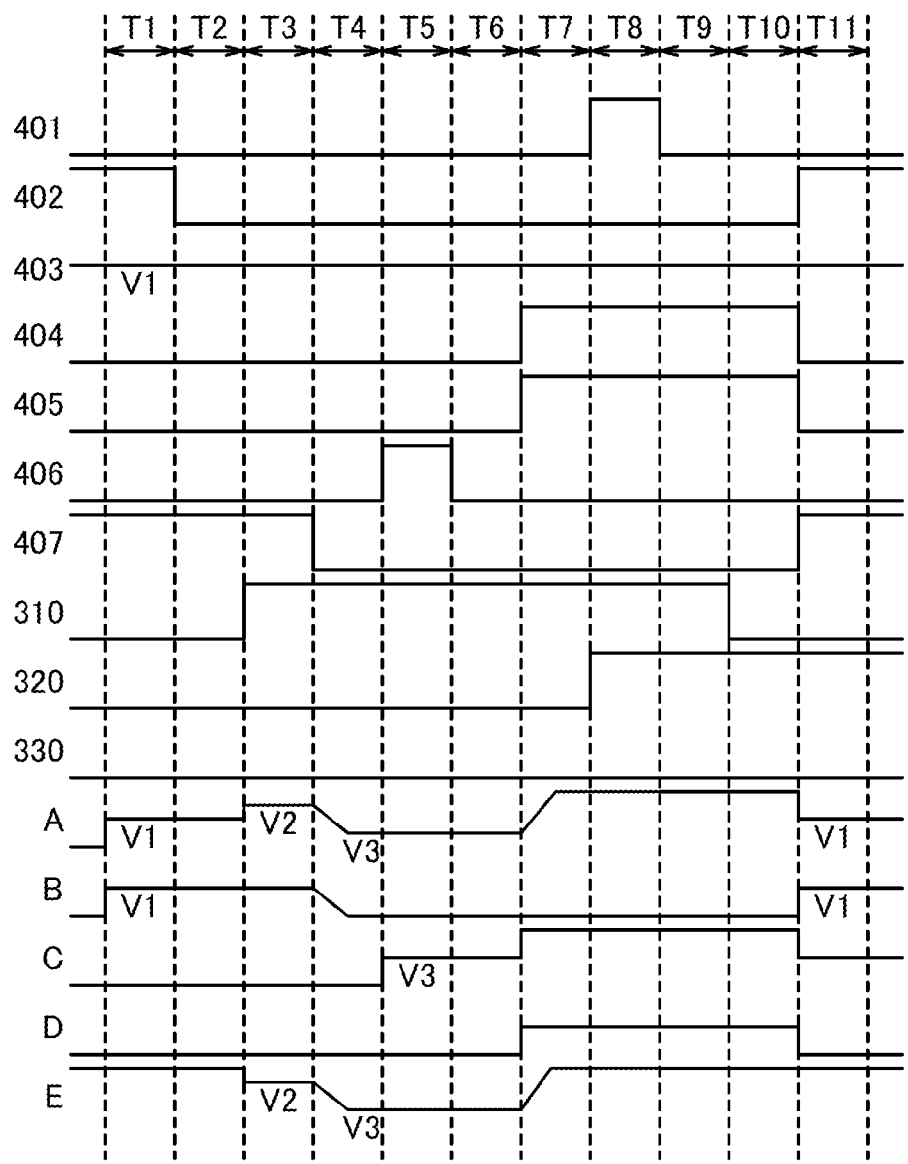
FIG. 7 illustrates a timing chart.

First, operation of reading data from the memory circuit 210 is described with reference to the timing chart of FIG. 7. Here, the case where high-level data is stored in the memory circuit 210 (the case where the potential of the node E is high) is described as an example.

In a period T1, the potential of the wiring 402 is set high while the potential of the wiring 403 is set to an intermediate potential (V1) between high-level and low-level potentials so that the transistors 421 to 423 are turned on. Accordingly, the node A and the node B are precharged to V1. Note that the potential of the wiring 407 is high.

In a period T2, the potential of the wiring 402 is set low to turn off the transistors 421 to 423. Accordingly, the node A and the node B which are precharged to V1 are brought into a floating state.

In a period T3, the potential of the wiring 310 is set high to turn on the transistor 441. Accordingly, the node E and the node A become conducting; thus, the potential of the node A is increased to V2, and the potential of the node E is decreased to V2. The potential of the node B is held at V1. Thus, the potential of the node A is higher than that of the node B.

The node A is connected to the wiring 407 through the transistor 431 and the node B is connected to the wiring 407 through the transistor 432; hence, the potentials of the node A and the node B come closer to the potential of the wiring 407 (low-level potential). Here, the potential of the node B is lower than that of the node A; thus, the potential of the node B reaches the low-level potential faster than that of the node A. When the potential of the node B reaches the low-level potential, the potential of the gate of the transistor 431 also becomes low, so that the transistor 431 is turned off. As a result, a decrease in the potential of the node A stops, and the potential of the node A becomes V3 that is higher than the potential of the node B (low-level potential) in a period T4. Moreover, in the period T4, the potential of the wiring 407 is set low.

In a period T5, the potential of the wiring 406 is set high to turn on the transistors 433 and 434. Accordingly, the potential of the node A is supplied to the node C through the transistor 433, and the potential of the node B is supplied to the node D through the transistor 434. As a result, the potential of the node C becomes V3, and the potential of the node D becomes low.

Next, in a period T6, the potential of the wiring 406 is set low to turn off the transistors 433 and 434. As a result, the node C and the node D are brought into a floating state.

In a period T7, the potential of the wiring 404 is set high. Furthermore, the potential of the wiring 405 is set high, so that the potentials of the node C and the node D are increased. Thus, the transistor 435 is turned on, and the potential of the node A comes closer to the potential of the wiring 404. As a result, the potential of the node A becomes high.

As the potential of the node D increases, the transistor 436 also becomes close to the on state in some cases. In that case, the potential of the wiring 404 (high-level potential) is supplied to the node B through the transistor 436. However, the potential of the node A is high at this time; thus, the potential of the gate of the transistor 432 also becomes high, and the transistor 432 is turned on. As a result, the potential of the node B comes close to the potential of the wiring 407 (low-level potential), and the potential of the node B remains low.

In a period T8, the potential of the wiring 401 is set high to turn on the transistors 411 and 412. Accordingly, the potential of the node A (high-level potential) is supplied to the wiring 320, and the potential of the node B (low-level potential) is supplied to the wiring 330. Here, the potential of the wiring 320 corresponds to the data (high-level data) stored in the memory circuit 210. Thus, the data stored in the memory circuit 210 can be read out by reading the potential of the wiring 320.

In a period T9, the potential of the wiring 401 is set low; thus, the node A and the node B are brought into a floating state.

In a period T10, the potential of the wiring 310 is set low to turn off the transistor 441. Accordingly, the potential of the node A (high-level potential) is held in the node E. By this operation, refresh of data (high-level potential) stored in the memory circuit 210 can be performed before reading.

In a period T11, the potentials of the wirings 404 and 405 are set low. The potential of the wiring 402 is set high so that the node A and the node B are precharged to V1. Furthermore, the potential of the wiring 407 is set high.

Through the above operation, the potential output from the memory circuit 210 can be amplified and read out.
(Writing to Memory Circuit)

Figure 8:
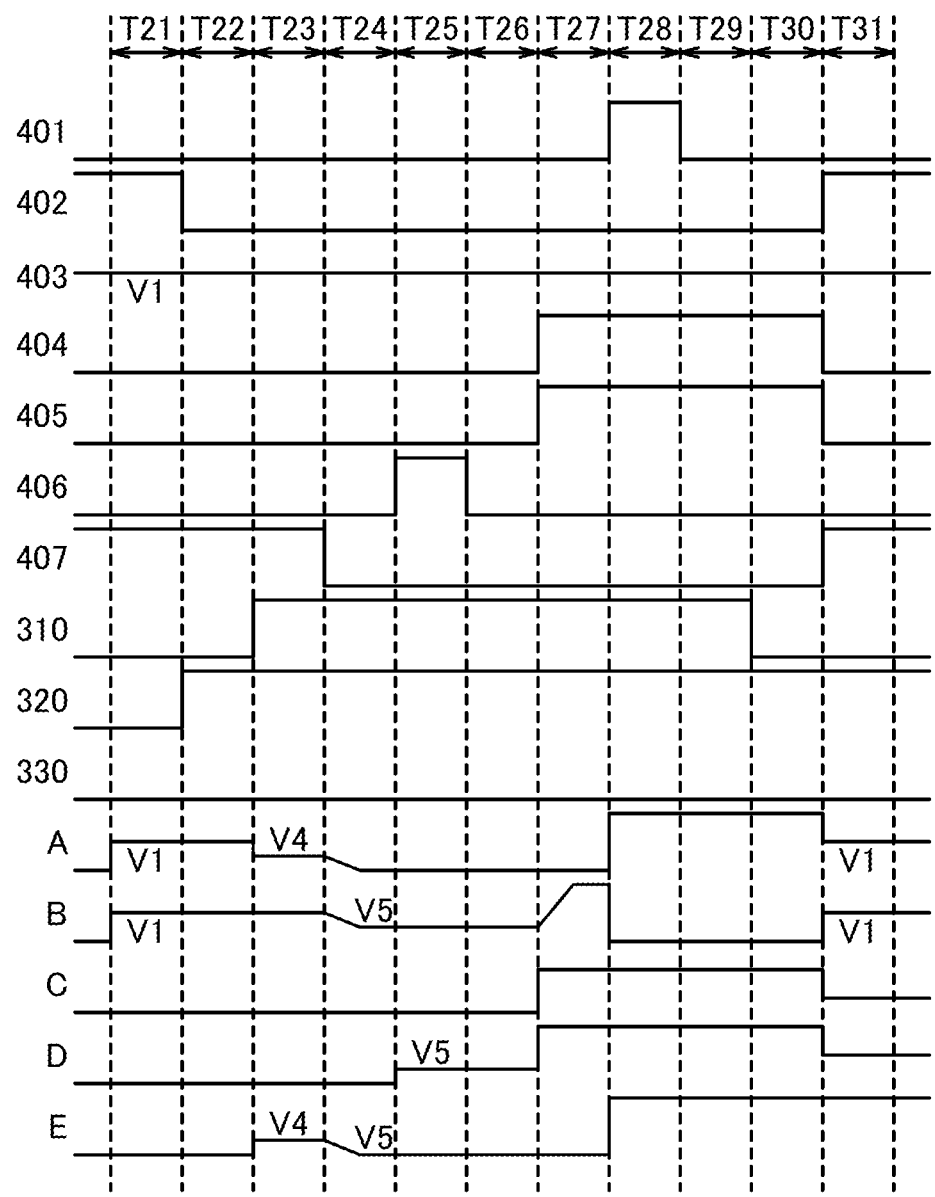
FIG. 8 illustrates a timing chart.

First, operation of writing data to the memory circuit 210 is described with reference to the timing chart of FIG. 8. Here, operation in the case where low-level data stored in the memory circuit 210 is rewritten to high-level data is described as an example.

First, in a period T21, the potential of the wiring 402 is set high while the potential of the wiring 403 is set to V1, whereby the transistors 421 to 423 are turned on. Accordingly, the node A and the node B are precharged to V1. Note that the potential of the wiring 407 is high.

Next, in a period T22, the potential of the wiring 402 is set low to turn off the transistors 421 to 423. Accordingly, the node A and the node B which are precharged to V1 are brought into a floating state. Further, the potential of the wiring 320 is set high. The potential of the wiring 320 corresponds to data to be written to the memory circuit 210.

In a period T23, the potential of the wiring 310 is set high to turn on the transistor 441. Accordingly, the node E and the node A become conducting; thus, the potential of the node A is decreased to V4, and the potential of the node E is increased to V4. Meanwhile, the potential of the node B is held at V1. Thus, the potential of the node A is lower than that of the node B.

The node A is connected to the wiring 407 through the transistor 431, and the node B is connected to the wiring 407 through the transistor 432; hence, the potentials of the node A and the node B come closer to the potential of the wiring 407 (low-level potential). Here, the potential of the node A is lower than that of the node B; thus, the potential of the node A reaches the low level potential faster than that of the node B. When the potential of the node A becomes low, the potential of the gate of the transistor 432 also becomes low, so that the transistor 432 is turned off. As a result, a decrease in the potential of the node B stops, and the potential of the node B becomes V5 that is higher than the potential of the node A (low-level potential) in a period T24. Further, in the period T24, the potential of the wiring 407 is set low.

In a period T25, the potential of the wiring 406 is set high to turn on the transistors 433 and 434. Accordingly, the potential of the node A is supplied to the node C through the transistor 433, and the potential of the node B is supplied to the node D through the transistor 434. As a result, the potential of the node C becomes low and the potential of the node D becomes V5.

In a period T26, the potential of the wiring 406 is set low to turn off the transistors 433 and 434. Accordingly, the node C and the node D are brought into a floating state.

In a period T27, the potential of the wiring 404 is set high. Further, the potential of the wiring 405 is set high to increase the potentials of the node C and the node D. Thus, the transistor 436 is turned on, and the potential of the node B reaches the potential of the wiring 404. As a result, the potential of the node B becomes high.

As the potential of the node C increases, the transistor 435 also becomes close to the on state in some cases. In that case, the potential of the wiring 404 (high-level potential) is supplied to the node A through the transistor 435. However, the potential of the node B is high at this time; thus, the potential of the gate of the transistor 431 also becomes high, so that the transistor 431 is turned on. As a result, the potential of the node A comes closer to the potential of the wiring 407 (low-level potential), and the potential of the node A remains low.

In a period T28, the potential of the wiring 401 is set high to turn on the transistors 411 and 412. Accordingly, the potential of the wiring 320 (high-level potential) is supplied to the node A and the node E, and the potential of the wiring 330 (low-level potential) is supplied to the node B. Note that the potential of the wiring 320 (high-level potential) corresponds to the data to be written to the memory circuit 210.

In a period T29, the potential of the wiring 401 is set low. Accordingly, the node A and the node B are brought into a floating state.

In a period T30, the potential of the wiring 310 is set low to turn off the transistor 441. Thus, the potential of the node A (high-level potential) is held in the node E. By this operation, the data (high-level potential) can be written in the memory circuit 210.

In a period T31, the potentials of the wirings 404 and 405 are set low. Further, the potential of the wiring 402 is set high so that the node A and node B are precharged to V1. Further, the potential of the wiring 407 is set high.

Through the above operation, rewiring of the data stored in the memory circuit 210 can be performed.

Note that the structure of the amplifier circuit 220 is not limited to that shown in FIG. 6. For example, the amplifier circuit 220 may have a structure shown in FIG. 9. The structure of the amplifier circuit 220 in FIG. 9 is the same as that in FIG. 6 except for the structure of the circuit 430.

Figure 9:
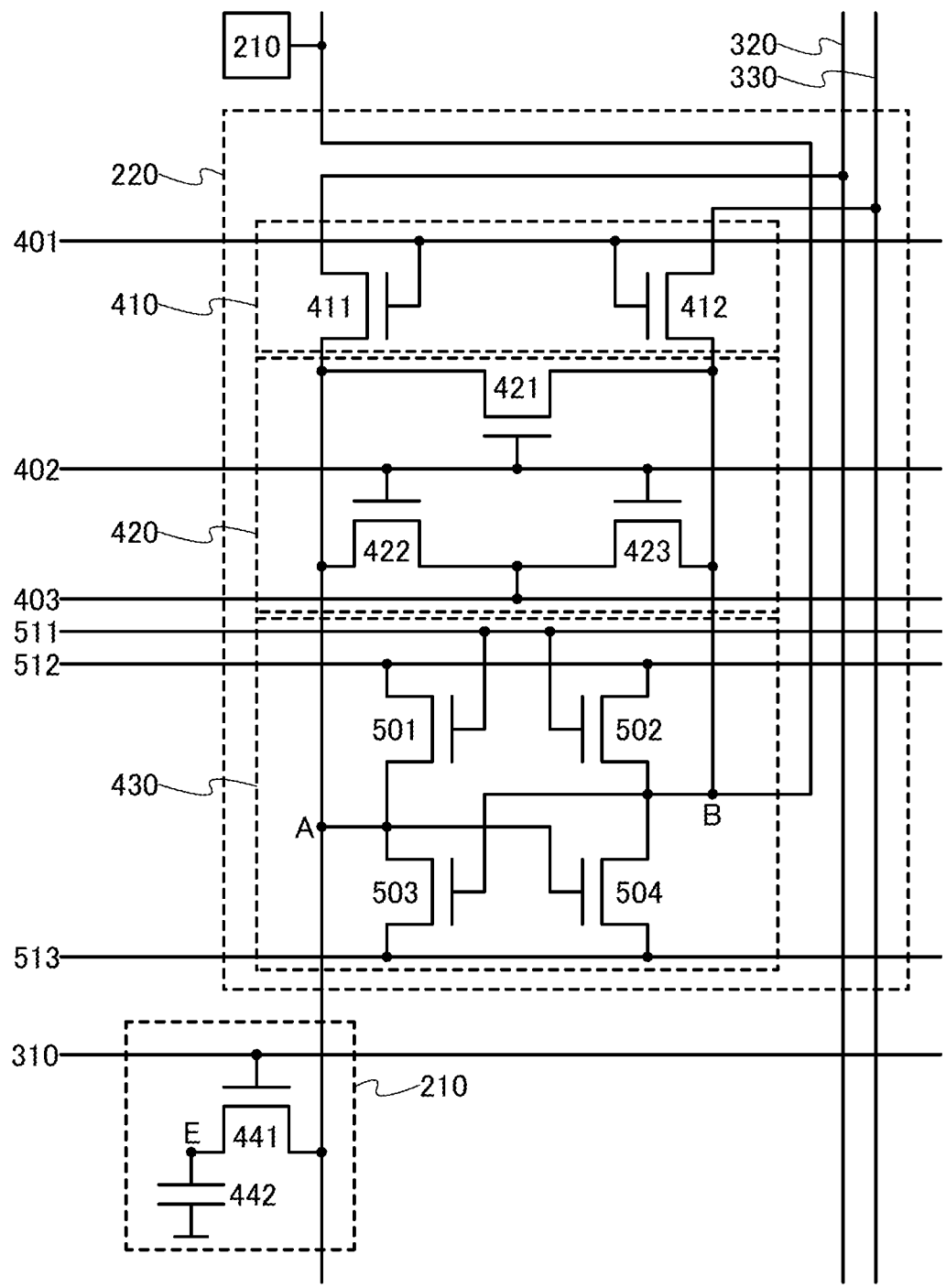
FIG. 9 is a circuit diagram illustrating an example of a structure of a semiconductor device.

The circuit 430 in FIG. 9 includes transistors 501 to 504. A gate of the transistor 501 is connected to a wiring 511, one of a source and a drain thereof is connected to a wiring 512, and the other of the source and the drain thereof is connected to the node A. A gate of the transistor 502 is connected to the wiring 511, one of a source and a drain thereof is connected to the wiring 512, and the other of the source and the drain thereof is connected to the node B. A gate of the transistor 503 is connected to the node B, one of a source and a drain thereof is connected to the node A, and the other of the source and the drain thereof is connected to the wiring 513. A gate of the transistor 504 is connected to the node A, one of a source and a drain thereof is connected to the node B, and the other of the source and the drain thereof is connected to the wiring 513.

The circuit 430 in FIG. 9, as well as the circuit 430 in FIG. 6, has a function of amplifying the potential of the node A and supplying the amplified potential to the memory circuit 210 or the wiring 320, and a function of amplifying the potential of the node B and supplying the amplified potential to the memory circuit 210 or the wiring 330.

The transistors 501 to 504 can be formed using materials similar to those used for the transistors 431 to 436 (see FIG. 6); however, the transistors 501 to 504 are preferably OS transistors.

Figure 10:
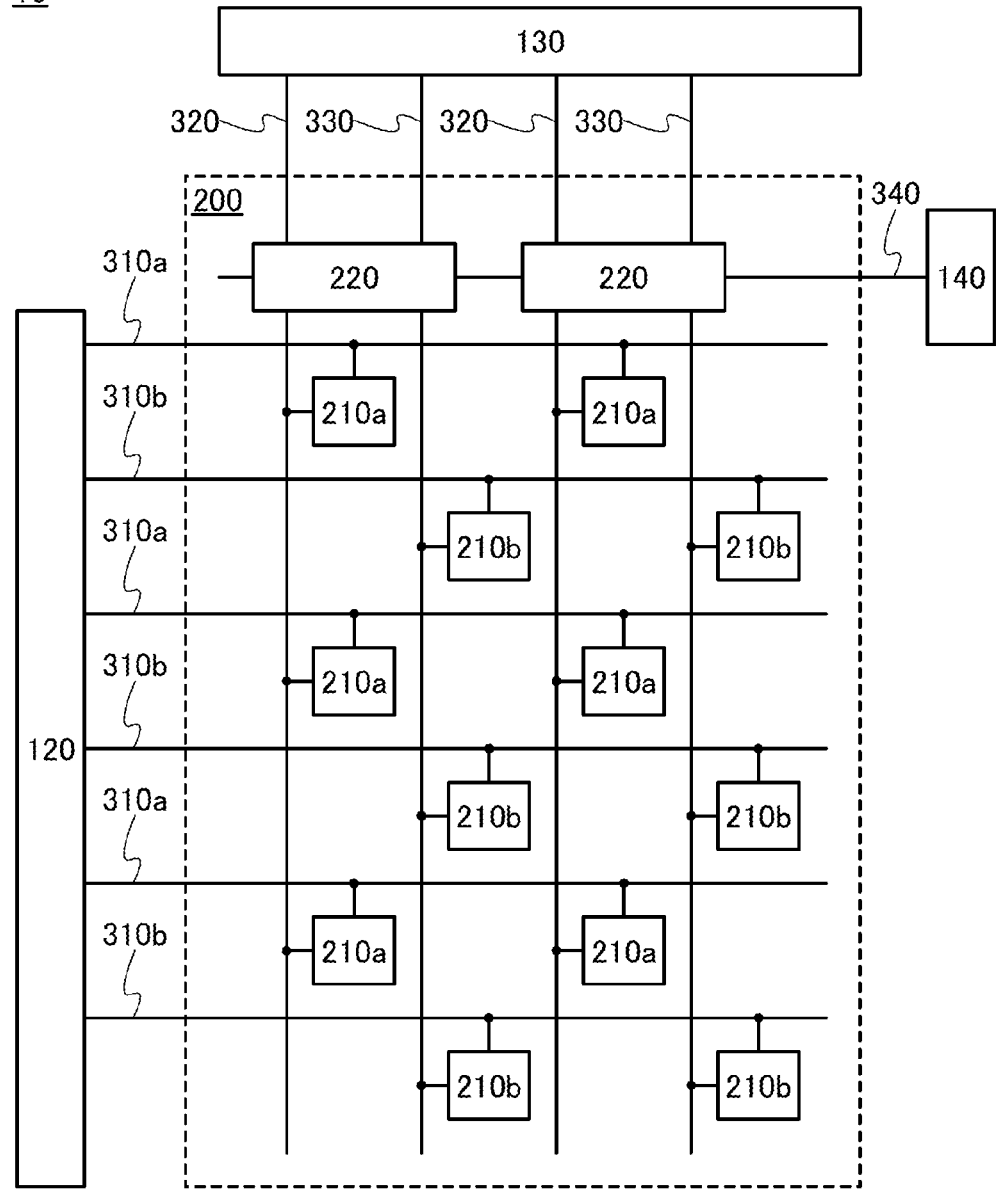
FIG. 10 illustrates an example of a structure of a semiconductor device.

The semiconductor device 10 may have a structure shown in FIG. 10. The structure of the semiconductor device 10 in FIG. 10 is the same as that in FIG. 5 except for the structure of the circuit 200.

The circuit 200 in FIG. 10 includes a plurality of memory circuits 210*a*, a plurality of memory circuits 210*b*, and a plurality of amplifier circuits 220. Here, the memory circuits 210*a* are provided in odd-numbered rows and odd-numbered columns, and the memory circuits 210*b* are provided in even-numbered rows and even-numbered columns. Further, the memory circuits 210*a* is connected to the wiring 310*a* in the odd-numbered rows, and the memory circuits 210*b* is connected to the wiring 310*b* in the even-numbered rows.

The amplifier circuits 220 are each connected to a plurality of memory circuits 210. Specifically, each amplifier circuit 220 is connected to the memory circuits 210 in two columns. Here, an example is given in which each amplifier circuit 220 is connected to a plurality of memory circuits 210*a* in the odd-numbered columns and a plurality of memory circuits 210*b* in the even-numbered columns.

Also in the circuit 200 having the above-described structure, the potential supplied to the wiring 320 or the wiring 330 can be amplified and written to the memory circuits 210*a* or the memory circuits 210*b*, as in the circuit 200 in FIG. 5. Further, the data stored in the memory circuits 210*a* or the memory circuits 210*b* can be amplified and read out.

Note that for convenience of description, in the drawing, the plurality of memory circuits 220 do not overlap with the plurality of memory circuits 210*a* and the plurality of memory circuit 210*b* in the circuit 200; however, as shown in FIGS. 3A and 4, the plurality of amplifier circuits 220 and the plurality of memory circuits 210*a* and 210*b* are stacked. That is, the plurality of amplifier circuits 220 are provided over the plurality of memory circuits 210*a* and 210*b* through an insulating layer.

As described above, in one embodiment of the present invention, the semiconductor device in which the circuit 31 including the memory circuits and the circuit 32 including the amplifier circuits are stacked or in which the circuit 20 and the circuit 31 or 32 are stacked can be obtained. Thus, the memory circuits and the amplifier circuits can be mounted on the semiconductor device 10 while the increase in the area of the semiconductor device 10 is suppressed. Therefore, the area of the semiconductor device 10 can be reduced.

Further, the use of OS transistors for the circuits enables the memory circuits and the amplifier circuits to have low off-state current and operate at high speed. Thus, a reduction in power consumption and improvement in operation speed of the semiconductor device 10 can be achieved.

This embodiment can be combined with any other embodiment as appropriate.

Embodiment 3

In this embodiment, structures of a transistor that can be used in a memory circuit, an amplifier circuit, or the like is described.

FIGS. 11A to 11D illustrate an example of a method for manufacturing a semiconductor device having a structure in which a transistor 620 and a transistor 630 are stacked. Here, description is made on the case where the transistor 620 includes a single crystal semiconductor in a channel formation region and the transistor 630 is an OS transistor.

Figure 11A:
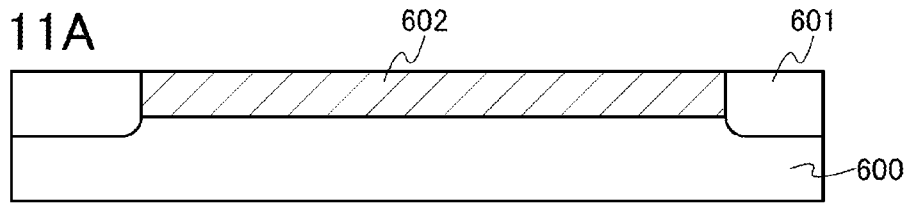
FIGS. 11A to 11D illustrate an example of a structure of a transistor.

First, an element isolation insulator 601 and an n-type well 602 are formed in a semiconductor substrate 600 (FIG. 11A).

Next, a gate insulating film 603 and a gate electrode 604 are formed, and p-channel impurity regions 605 are formed in the n-type well 602. A layer which includes a higher conductivity material (such as silicide) than the impurity regions 605 may be stacked over the impurity regions 605. The impurity regions 605 may include an extension region.

Next, an insulating layer 606 is formed. The insulating layer 606 may be a single layer or a multilayer and is preferably capable of supplying oxygen to a layer provided over the insulating layer 606 and blocking the entry of hydrogen or water from a layer provided below the insulating layer 606 to the layer provided over the insulating layer 606.

Figure 11B:
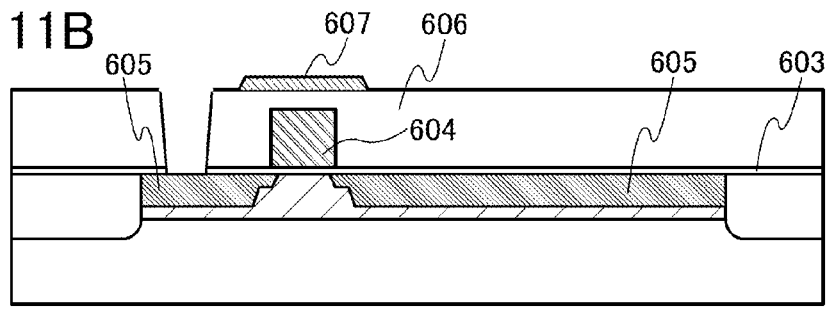

Next, an oxide semiconductor layer 607 is formed over the insulating layer 606 (FIG. 11B). After that, a contact hole which reaches one of the impurity regions 605 is formed in the gate insulating film 603 and the insulating layer 606.

A conductive material is deposited to fill the contact hole. Here, the oxide semiconductor layer 607 is covered with the conductive material. The conductive material may be a single layer or a multilayer. Then, the conductive material is selectively etched to form wirings 608. Note that a conductive layer in contact with the one of the impurity regions 605 may be formed in the contact hole so that the conductive layer is in contact with one of the wirings 608.

Figure 11C:
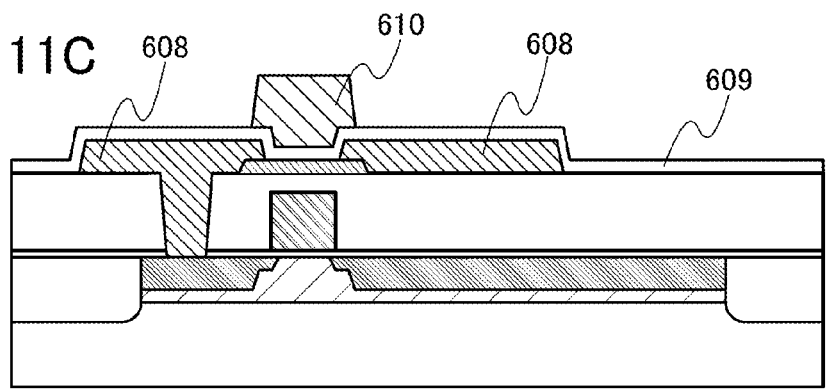

Next, a gate insulating film 609 covering the wirings 608 is formed. Further, a conductive material is deposited over the gate insulating film 609. The conductive material may be a single layer or a multilayer. The conductive material is preferably capable of blocking the entry of hydrogen or water from a layer provided over the conductive material to the layer provided below the conductive material. Then, the conductive material is selectively etched to form a gate electrode 610 (FIG. 11C).

Figure 11D:
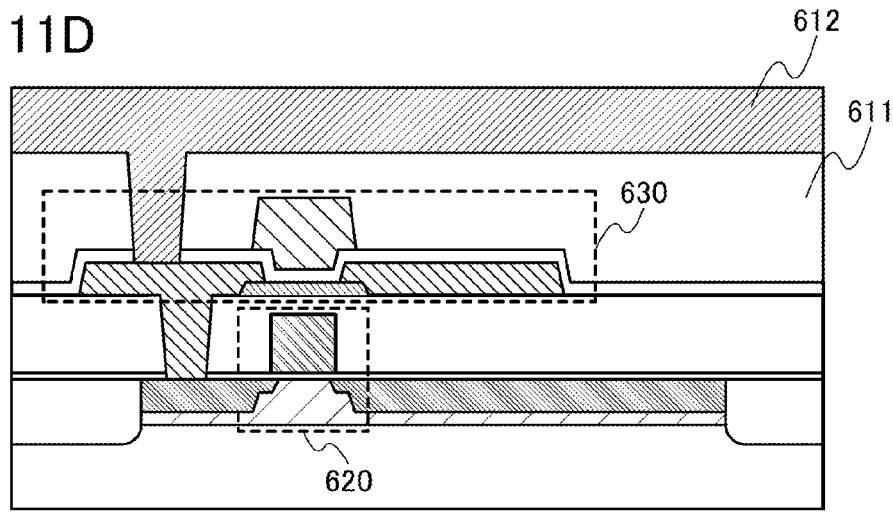

Next, an insulating layer 611 is deposited. A contact hole which reaches the one of the wirings 608 is formed in the gate insulating film 609 and the insulating layer 611, and the contact hole is filled with a conductive material, whereby a wiring 612 is formed (FIG. 11D). Note that a conductive layer in contact with the one of the wirings 608 may be formed in the contact hole so that the conductive layer is in contact with the wiring 612. The wiring 612 may be a single layer or a multilayer.

As described-above, the semiconductor device in which the transistor 620 including a single crystal semiconductor in a channel formation region and the transistor 630 that is an OS transistor are stacked can be manufactured.

Note that in FIG. 11D, the one of the impurity regions 605 is connected to the one of the wirings 608. That is, one of a source and a drain of the transistor 620 is connected to one of a source and a drain of the transistor 630. Such a structure can be applied to the transistor in FIGS. 6 and 9. For example, the transistor 620 corresponds to the transistor 441 and the like in FIGS. 6 and 9, and the transistor 630 corresponds to the transistors 411, 412, 421 to 423, 431 to 436 in FIG. 6 and the transistors 411, 412, 421 to 423, and 501 to 504 which are shown in FIG. 9. Further, the transistor 620 can be used for the circuit 20 (e.g., an integrated circuit included in the circuit 20 and the like) in FIGS. 1A to 1C, FIGS. 2A to 2C, FIGS. 3A and 3B, and FIG. 4.

Figure 12A:
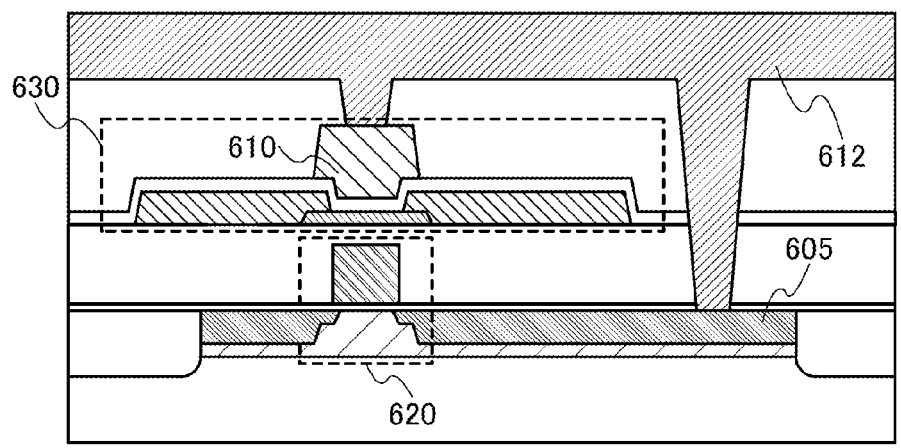
FIGS. 12A to 12C illustrate examples of a structure of a transistor.

It is needless to say that the connection between the transistors 620 and 630 is not limited to that shown in FIGS. 11A to 11D. For example, as shown in FIG. 12A, one of the impurity regions 605 may be connected to the gate electrode 610 through the wiring 612. Thus, a structure in which one of the source and the drain of the transistor 620 is connected to a gate of the transistor 630 can be obtained. For example, the transistor 620 in FIG. 12A corresponds to the transistor 441 in FIGS. 6 and 9, and the transistor 630 corresponds to the transistor 432 in FIG. 6 and the transistor 504 in FIG. 9.

Figure 12B:
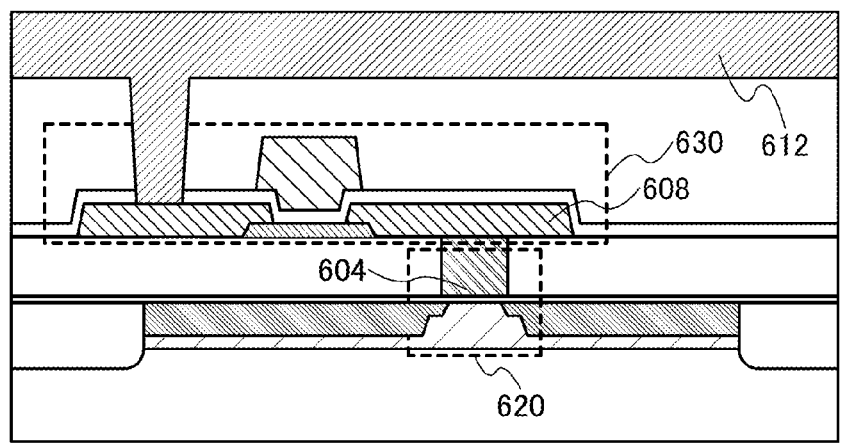

Further, as shown in FIG. 12B, the gate electrode 604 can be connected to one of the wirings 608. With this structure, a structure in which a gate of the transistor 620 is connected to one of the source and the drain of the transistor 630 can be obtained.

Figure 12C:
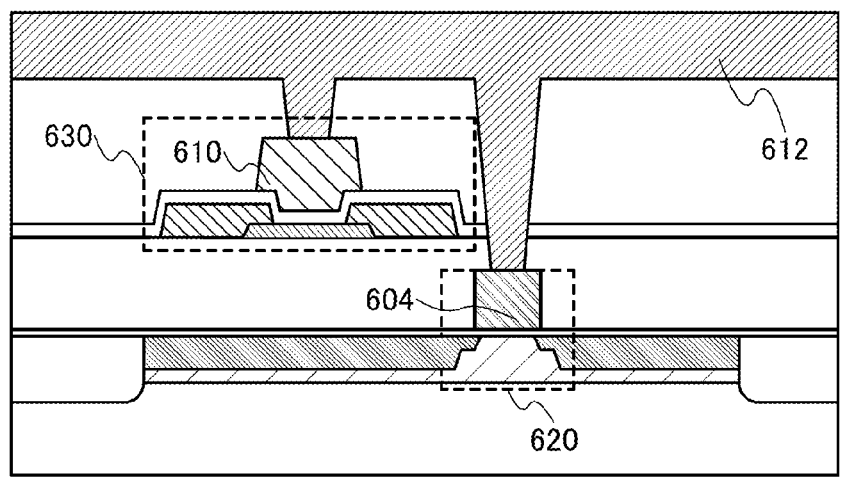

Further, as shown in FIG. 12C, the gate electrode 604 can be connected to the gate electrode 610 through the wiring 612. Accordingly, the gate of the transistor 620 and the gate of the transistor 630 can be connected to each other.

As shown in FIG. 11D and FIGS. 12A to 12C, the transistors 620 and 630 may have mutually overlapping regions with the insulating layer 606 provided therebetween. For example, as shown in FIG. 11D and FIG. 12A, the channel formation regions of the transistors 620 and 630 may have mutually overlapping regions with the insulating layer 606 provided therebetween. Further, as shown in FIG. 11D and FIG. 12A, the gate electrode 604 of the transistor 620 and the gate electrode 610 of the transistor 630 may have mutually overlapping regions with the insulating layer 606 provided therebetween. Thus, the area of the circuit including the transistors 620 and 630 can be reduced.

The stacked-layer structure of the transistors shown in FIG. 11D and FIGS. 12A to 12C can be appropriately used in any of circuits shown in FIGS. 1A to 1C, FIGS. 2A to 2C, FIGS. 3A and 3B, FIG. 4, FIG. 5, FIG. 6, FIG. 9, and FIG. 10.

This embodiment can be implemented in appropriate combination with any of the other embodiments and the like.

Embodiment 4

In this embodiment, a structure of a transistor which can be used for a memory circuit or a logic circuit is described.
<Example of Cross-Sectional Structure of Semiconductor Device>

Figure 13:
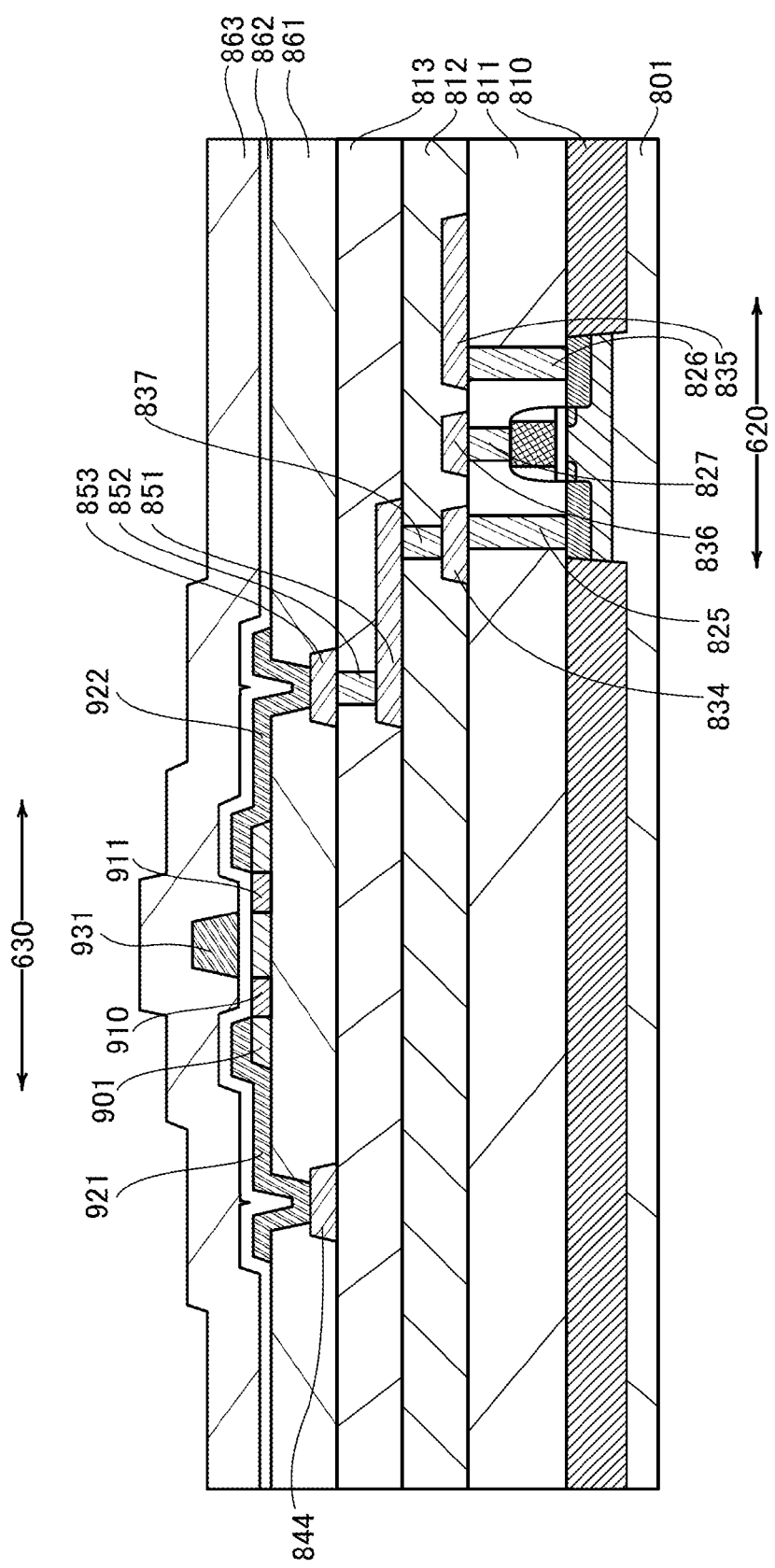
FIG. 13 illustrates an example of a structure of a transistor.

FIG. 13 shows an example of the structure of the transistors 620 and 630. Note that FIG. 13 illustrates an example in which the transistor 630 that is an OS transistor is formed over the transistor 620 that is a transistor whose channel formation region is formed in a single-crystal silicon substrate (hereinafter also referred to as Si transistor). The structure in which an OS transistor is stacked over a Si transistor can be used for any of the transistors included in the circuits shown in FIGS. 1A to 1C, FIGS. 2A to 2C, FIGS. 3A and 3B, FIG. 4, FIG. 5, FIG. 6, FIG. 9, and FIG. 10. In this embodiment, as in FIG. 11D, one of a source and a drain of the transistor 620 is electrically connected to one of a source and a drain of the transistor 630; however, one embodiment of the present invention is not limited thereto. One of the source and the drain of the transistor 620 may be connected to a gate of the transistor 630 (see FIG. 12A), a gate of the transistor 620 may be connected to one of the source and the drain of the transistor 630 (see FIG. 12B), or the gate of the transistor 620 may be connected to the gate of the transistor 630 (see FIG. 12C).

The transistor 620 may include its channel formation region in a semiconductor film or a semiconductor substrate of silicon, germanium, or the like in an amorphous, microcrystalline, polycrystalline, or single crystal state. Alternatively, the transistor 620 may include its channel formation region in an oxide semiconductor film or an oxide semiconductor substrate. In the case where the transistors each include its channel formation region in an oxide semiconductor film or an oxide semiconductor substrate, the transistor 630 is not necessarily stacked over the transistor 620, and the transistors 630 and 620 may be formed in the same layer.

In the case where the transistor 620 is formed using a thin silicon film, any of the following can be used in the thin film: amorphous silicon formed by a sputtering method or a vapor phase growth method such as a plasma-enhanced chemical vapor deposition (CVD) method; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A semiconductor substrate 801 where the transistor 620 is formed can be, for example, a silicon substrate, a germanium substrate, or a silicon germanium substrate. In FIG. 13, a single crystal silicon substrate is used as the semiconductor substrate 801.

The transistor 620 is electrically isolated by an element isolation method. As the element isolation method, a selective oxidation method (a local oxidation of silicon (LOCOS) method), a trench isolation method (a shallow trench isolation (STI) method), or the like can be used. FIG. 13 illustrates an example where the trench isolation method is used to electrically isolate the transistor 620. Specifically, in FIG. 13, an element isolation region 810 is formed in such a manner that an insulator including silicon oxide or the like is buried in a trench formed in the semiconductor substrate 801 by etching or the like, so that the transistor 620 is electrically isolated by element isolation.

An insulating film 811 is provided over the transistor 620. Openings are formed in the insulating film 811. Conductive films 825 and 826 that are electrically connected to the source or the drain of the transistor 620 and a conductive film 827 that is electrically connected to the gate of the transistor 620 are formed in the openings.

The conductive film 825 is electrically connected to a conductive film 834 formed over the insulating film 811. The conductive film 826 is electrically connected to a conductive film 835 formed over the insulating film 811. The conductive film 827 is electrically connected to a conductive film 836 formed over the insulating film 811.

An insulating film 812 is formed over the conductive films 834 to 836. An opening is formed in the insulating film 812. A conductive film 837 electrically connected to the conductive film 834 is formed in the opening. The conductive film 837 is electrically connected to a conductive film 851 formed over the insulating film 812.

An insulating film 813 is formed over the conductive film 851. An opening is formed in the insulating film 813. A conductive film 852 electrically connected to the conductive film 851 is formed in the opening. The conductive film 852 is electrically connected to a conductive film 853 formed over the insulating film 813. A conductive film 844 is formed over the insulating film 813.

An insulating film 861 is formed over the conductive film 853 and the conductive film 844. In FIG. 13, the transistor 630 is formed over the insulating film 861.

The transistor 630 includes, over the insulating film 861, a semiconductor film 901 including an oxide semiconductor, conductive films 921 and 922 functioning as a source and a drain over the semiconductor film 901, a gate insulating film 862 over the semiconductor film 901 and the conductive films 921 and 922, and a gate electrode 931 which is over the gate insulating film 862 and overlaps with the semiconductor film 901 between the conductive films 921 and 922. Note that the conductive film 922 is electrically connected to the conductive film 853 in the opening formed in the insulating film 861.

In the semiconductor film 901 of the transistor 630, there is a region 910 between a region overlapping with the conductive film 921 and a region overlapping with the gate electrode 931. In addition, in the semiconductor film 901 of the transistor 630, there is a region 911 between a region overlapping with the conductive film 922 and a region overlapping with the gate electrode 931. When argon, an impurity which imparts p-type conductivity to the semiconductor film 901, or an impurity which imparts n-type conductivity to the semiconductor film 901 is added to the regions 910 and 911 using the conductive films 921 and 922 and the gate electrode 931 as masks, the resistivity of the regions 910 and 911 can be made lower than that of the region overlapping with the gate electrode 931 in the semiconductor film 901.

An insulating film 863 is provided over the transistor 630.

In FIG. 13, the transistor 630 has the gate electrode 931 on at least one side of the semiconductor film 901; alternatively, the transistor 630 may have a pair of gate electrodes with the semiconductor film 901 positioned therebetween.

In the case where the transistor 630 has a pair of gate electrodes with the semiconductor film 901 positioned therebetween, one of the gate electrodes may be supplied with a signal for controlling the on/off state, and the other of the gate electrodes may be supplied with a potential from another element. In this case, potentials with the same level may be supplied to the pair of gate electrodes, or a fixed potential such as the ground potential may be supplied only to the other of the gate electrodes. By controlling the level of the potential supplied to the other of the gate electrodes, the threshold voltage of the transistor can be controlled.

In FIG. 13, the transistor 630 has a single-gate structure including one channel formation region corresponding to one gate electrode 931. However, the transistor 630 may have a multi-gate structure where a plurality of electrically connected gate electrodes are provided so that a plurality of channel formation regions are included in one active layer.

<Transistor>

Then, structure examples of the OS transistor will be described.

Figure 14A:
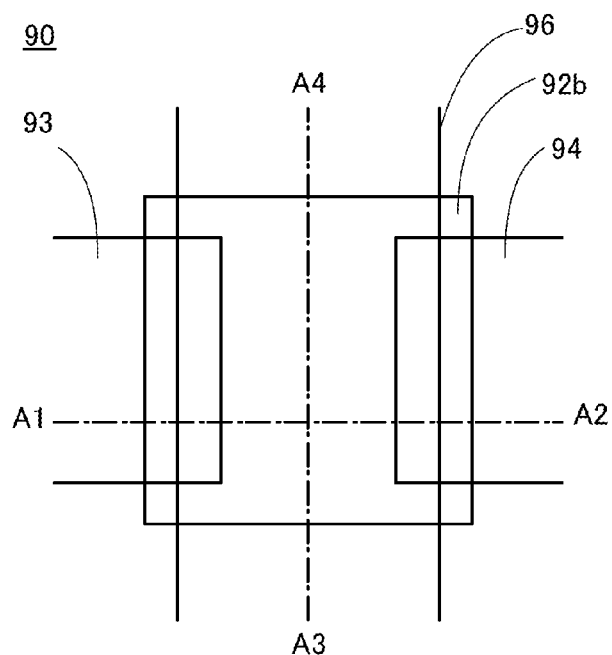
FIGS. 14A to 14C illustrate an example of a structure of a transistor.
Figure 14C:
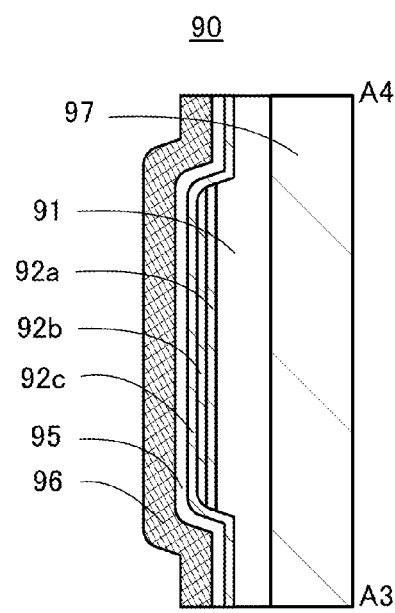
Figure 14B:
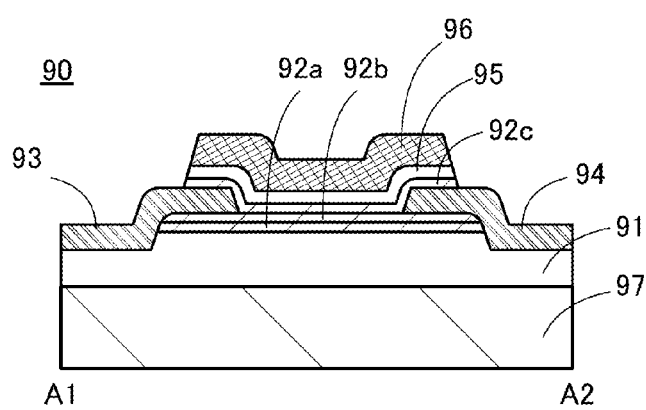

FIGS. 14A to 14C illustrate a structure of a transistor 90 that is an OS transistor as an example. FIG. 14A is a top view of the transistor 90. Note that insulating films are not illustrated in FIG. 14A in order to clarify the layout of the transistor 90. FIG. 14B is a cross-sectional view along dashed-dotted line A1-A2 in the top view in FIG. 14A. FIG. 14C is a cross-sectional view along dashed-dotted line A3-A4 in the top view in FIG. 14A.

As illustrated in FIGS. 14A to 14C, the transistor 90 includes an oxide semiconductor film 92*a* and an oxide semiconductor film 92*b* that are stacked in this order over an insulating film 91 formed over a substrate 97; a conductive film 93 and a conductive film 94 that are electrically connected to the oxide semiconductor film 92*b* and function as a source electrode and a drain electrode; an oxide semiconductor film 92*c* over the oxide semiconductor film 92*b*, the conductive film 93, and the conductive film 94; an insulating film 95 that functions as a gate insulating film and is located over the oxide semiconductor film 92*c*; and a conductive film 96 that functions as a gate electrode, lies over the insulating film 95, and overlaps with the oxide semiconductor films 92*a* to 92*c*. Note that the substrate 97 may be a glass substrate, a semiconductor substrate, or the like or may be an element substrate where semiconductor elements are formed over a glass substrate or on a semiconductor substrate.

Figure 15A:
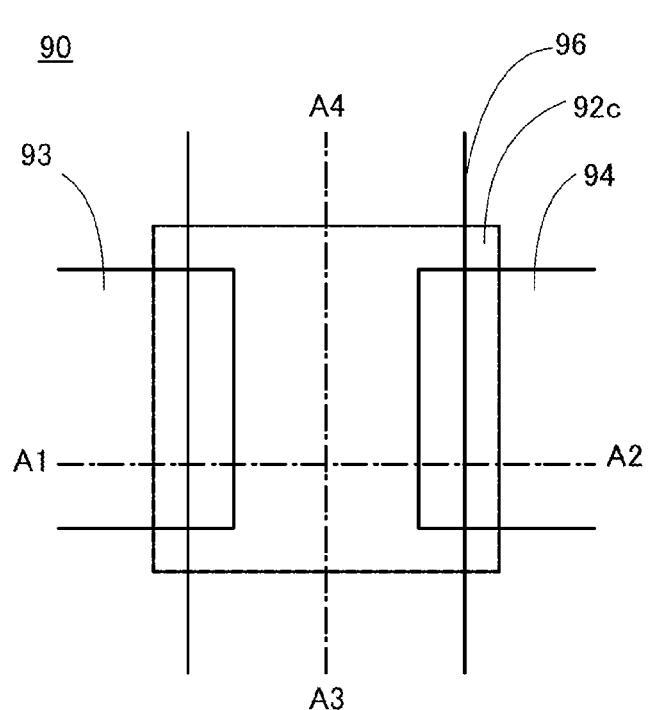
FIGS. 15A to 15C illustrate an example of a structure of a transistor.
Figure 15C:
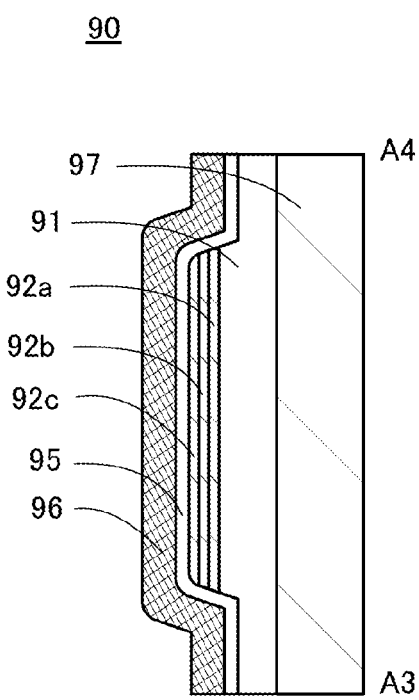
Figure 15B:
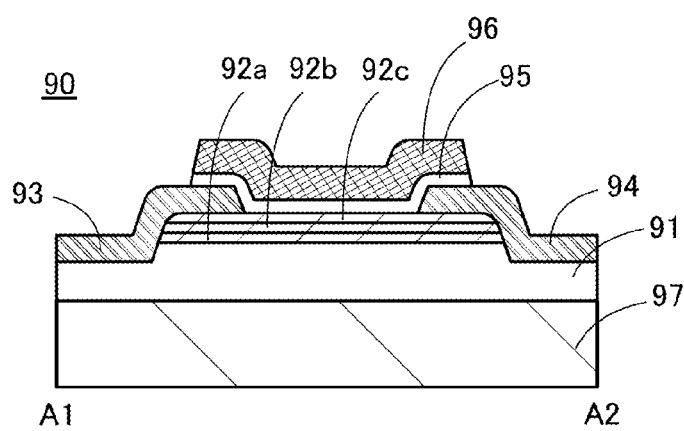

FIGS. 15A to 15C illustrate another specific example of the structure of the transistor 90. FIG. 15A is a top view of the transistor 90. Note that insulating films are not illustrated in FIG. 15A in order to clarify the layout of the transistor 90. FIG. 15B is a cross-sectional view along dashed-dotted line A1-A2 in the top view in FIG. 15A. FIG. 15C is a cross-sectional view along dashed-dotted line A3-A4 in the top view in FIG. 15A.

As illustrated in FIGS. 15A to 15C, the transistor 90 includes the oxide semiconductor films 92*a* to 92*c* that are stacked in this order over the insulating film 91; the conductive films 93 and 94 that are electrically connected to the oxide semiconductor film 92*c* and function as a source electrode and a drain electrode; the insulating film 95 that functions as a gate insulating film and is located over the oxide semiconductor film 92*c* and the conductive films 93 and 94; and the conductive film 96 that functions as a gate electrode, lies over the insulating film 95, and overlaps with the oxide semiconductor films 92*a* to 92*c*.

FIG. 13 and FIGS. 14A to 14C each illustrate the structure example of the transistor 90 in which the oxide semiconductor films 92*a* to 92*c* are stacked. However, the structure of the oxide semiconductor film included in the transistor 90 is not limited to a stacked-layer structure including a plurality of oxide semiconductor films and may be a single-layer structure.

In the case where the transistor 90 includes the semiconductor film in which the oxide semiconductor films 92a to 92c are stacked in this order, each of the oxide semiconductor films 92a and 92c is an oxide film that contains at least one of metal elements contained in the oxide semiconductor film 92b and in which energy at the conduction band minimum is closer to the vacuum level than that in the oxide semiconductor film 92b by higher than or equal to 0.05 eV, 0.07 eV, 0.1 eV, or 0.15 eV and lower than or equal to 2 eV, 1 eV, 0.5 eV, or 0.4 eV. The oxide semiconductor film 92b preferably contains at least indium because carrier mobility is increased.

In the case where the transistor 90 includes the semiconductor films with the above structure, when an electric field is applied to the semiconductor films by applying voltage to the gate electrode, a channel region is formed in the oxide semiconductor film 92b which has the lowest conduction band minimum among the semiconductor films. That is, since the oxide semiconductor film 92c is provided between the oxide semiconductor film 92b and the insulating film 95, a channel region can be formed in the oxide semiconductor film 92b which is separated from the insulating film 95.

Since the oxide semiconductor film 92c contains at least one of metal elements contained in the oxide semiconductor film 92b, interface scattering is unlikely to occur at the interface between the oxide semiconductor film 92b and the oxide semiconductor film 92c. Thus, the movement of carriers is unlikely to be inhibited at the interface, which results in an increase in the field-effect mobility of the transistor 90.

When an interface state is formed at the interface between the oxide semiconductor films 92b and 92a, a channel region is formed also in a region close to the interface, which varies the threshold voltage of the transistor 90. However, since the oxide semiconductor film 92a contains at least one of metal elements contained in the oxide semiconductor film 92b, an interface state is unlikely to be formed at the interface between the oxide semiconductor films 92b and 92a. Accordingly, the above structure can reduce variations in the electrical characteristics of the transistor 90, such as the threshold voltage.

Further, it is preferable that a plurality of oxide semiconductor films be stacked so that an interface state due to an impurity existing between the oxide semiconductor films, which inhibits carrier flow, is not formed at an interface between the oxide semiconductor films. This is because when an impurity exists between the stacked oxide semiconductor films, the energy continuity of the conduction band minimum between the oxide semiconductor films is lost, and carriers are trapped or disappear by recombination in the vicinity of the interface. By reducing an impurity existing between the films, a continuous junction (here, in particular, a well structure having a U shape in which the conduction band minimum is changed continuously between the films) is formed easily as compared with the case of merely stacking the plurality of oxide semiconductor films which contain at least one common metal as a main component.

In order to form such a continuous junction, it is necessary to form films continuously without being exposed to air, with use of a multi-chamber deposition apparatus (sputtering apparatus) including a load lock chamber. Each chamber in the sputtering apparatus is preferably subjected to high vacuum evacuation (to a vacuum of $5 \times 10^{-7}$ Pa to $1 \times 10^{-4}$ Pa) with use of a suction vacuum evacuation pump such as a cryopump so that water or the like, which is an impurity for an oxide semiconductor, is removed as much as possible. Alternatively, a turbo molecular pump and a cold trap are preferably used in combination to prevent backflow of gas into the chamber through an evacuation system.

To obtain a highly purified intrinsic oxide semiconductor, not only high vacuum evacuation of the chambers but also high purification of a gas used in the sputtering is important. When an oxygen gas or an argon gas used as the above gas has a dew point of −40° C. or lower, preferably −80° C. or lower, further preferably −100° C. or lower and is highly purified, moisture and the like can be prevented from entering the oxide semiconductor film as much as possible. Specifically, in the case where the oxide semiconductor film 92b is an In-M-Zn oxide film (M represents Al, Ti, Ga, Y, Zr, La, Ce, Nd, or Hf) and a target having the atomic ratio of metal elements of In:M:Zn=$x_1$:$y_1$:$z_1$ is used for forming the oxide semiconductor film 92b, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a c-axis aligned crystalline oxide semiconductor (CAAC-OS) film as the oxide semiconductor film 92b is easily formed. Typical examples of the atomic ratio of the metal elements of the target are In:M:Zn=1:1:1 and In:M:Zn=3:1:2. Note that the CAAC-OS will be described in detail later.

Specifically, in the case where the oxide semiconductor film 92a and the oxide semiconductor film 92c are an In-M-Zn oxide film (M represents Al, Ti, Ga, Y, Zr, La, Ce, Nd, or Hf) and a target having the atomic ratio of metal elements of In:M:Zn=$x_2$:$y_2$:$z_2$ is used for forming the oxide semiconductor films 92a and 92c, $x_2/y_2$ is preferably less than $x_1/y_1$, and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, CAAC-OS films are easily formed as the oxide semiconductor films 92a and 92c. Typical examples of the atomic ratio of the metal elements of the target are In:M:Zn=1:3:2, In:M:Zn=1:3:4, In:M:Zn=1:3:6, and In:M:Zn=1:3:8.

The oxide semiconductor film 92a and the oxide semiconductor film 92c each have a thickness of more than or equal to 3 nm and less than or equal to 100 nm, preferably more than or equal to 3 nm and less than or equal to 50 nm. The thickness of the oxide semiconductor film 92b is more than or equal to 3 nm and less than or equal to 200 nm, preferably more than or equal to 3 nm and less than or equal to 100 nm, further preferably more than or equal to 3 nm and less than or equal to 50 nm.

In the three-layer semiconductor film, the three oxide semiconductor films 92a to 92c can be either amorphous or crystalline. Note that the oxide semiconductor film 92b in which a channel region is formed preferably has a crystalline structure, in which case the transistor 90 can have stable electrical characteristics.

Note that a channel formation region refers to a region of a semiconductor film of the transistor 90 that overlaps with a gate electrode and is between a source electrode and a drain electrode. A channel region refers to a region through which current mainly flows in the channel formation region.

For example, when an In—Ga—Zn oxide film formed by a sputtering method is used as each of the oxide semiconductor films 92a and 92c, the oxide semiconductor films 92a and 92c can be deposited with the use of an In—Ga—Zn oxide target containing In, Ga, and Zn in an atomic ratio of 1:3:2. The deposition conditions can be as follows: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

Further, when the oxide semiconductor film 92b is a CAAC-OS film, the oxide semiconductor film 92b is preferably deposited with the use of a polycrystalline target containing In—Ga—Zn oxide (In:Ga:Zn=1:1:1 in an atomic ratio). The deposition conditions can be as follows: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW. When the oxide semiconductor film 92b is a CAAC-OS film, the oxide semiconductor film 92b may be deposited with the use of an In—Ga—Zn oxide target containing In, Ga, and Zn in an atomic ratio of 2:1:3. In the CAAC-OS film deposited with the use of the target, the proportion of a region where a diffraction pattern of the CAAC-OS film is observed in a predetermined area (also referred to as proportion of CAAC) can be high. As a result, the frequency characteristics of a transistor including a channel formation region in the CAAC-OS film can be high.

Note that the oxide semiconductor films 92a to 92c can be formed by a sputtering method.

There are few carrier generation sources in a highly purified oxide semiconductor (purified oxide semiconductor) obtained by reduction of impurities such as moisture and hydrogen serving as electron donors (donors) and reduction of oxygen vacancies; therefore, the highly purified oxide semiconductor can be an intrinsic (i-type) semiconductor or a substantially i-type semiconductor. For this reason, a transistor having a channel formation region in a highly purified oxide semiconductor film has an extremely low off-state current and high reliability. Thus, a transistor whose channel formation region is formed in the oxide semiconductor film easily has an electrical characteristic of a positive threshold voltage (also referred to as a normally-off characteristic).

Specifically, various experiments can prove a low off-state current of a transistor having a channel formation region in a highly purified oxide semiconductor film. For example, even when an element has a channel width of $1 \times 10^6$ μm and a channel length of 10 μm, off-state current can be less than or equal to the measurement limit of a semiconductor parameter analyzer, i.e., less than or equal to $1 \times 10^{-13}$ A, at a voltage (drain voltage) between the source electrode and the drain electrode of from 1 V to 10 V. In that case, it can be seen that the off-state current of the transistor normalized on the channel width is lower than or equal to 100 zA/μm. In addition, a capacitor and a transistor were connected to each other and off-state current was measured using a circuit in which charges flowing to or from the capacitor are controlled by the transistor. In the measurement, a highly purified oxide semiconductor film was used for a channel formation region of the transistor, and the off-state current of the transistor was measured from a change in the amount of charge of the capacitor per unit time. As a result, it was found that, in the case where the voltage between the source electrode and the drain electrode of the transistor is 3 V, a lower off-state current of several tens of yoctoamperes per micrometer (yA/μm) is obtained. Accordingly, the transistor including a channel formation region in the highly purified oxide semiconductor film has much lower off-state current than a crystalline silicon transistor.

In the case where an oxide semiconductor film is used as the semiconductor film, at least indium (In) or zinc (Zn) is preferably included as an oxide semiconductor. In addition, as a stabilizer for reducing variations in electrical characteristics among transistors formed using such an oxide semiconductor, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Among oxide semiconductors, unlike silicon carbide, gallium nitride, or gallium oxide, an In—Ga—Zn oxide, an In—Sn—Zn oxide, or the like has an advantage of high mass productivity because a transistor with favorable electrical characteristics can be formed by a sputtering method or a wet process. Further, unlike silicon carbide, gallium nitride, or gallium oxide, with the use of the In—Ga—Zn oxide, a transistor with favorable electrical characteristics can be formed over a glass substrate. Further, a larger substrate can be used.

As another stabilizer, one or more lanthanoids selected from lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, any of the following oxides can be used, for example: indium oxide, gallium oxide, tin oxide, zinc oxide, an In—Zn oxide, an Sn—Zn oxide, an Al—Zn oxide, a Zn—Mg oxide, an Sn—Mg oxide, an In—Mg oxide, an In—Ga oxide, an In—Ga—Zn oxide (also referred to as IGZO), an In—Al—Zn oxide, an In—Sn—Zn oxide, an Sn—Ga—Zn oxide, an Al—Ga—Zn oxide, an Sn—Al—Zn oxide, an In—Hf—Zn oxide, an In—La—Zn oxide, an In—Pr—Zn oxide, an In—Nd—Zn oxide, an In—Ce—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, an In—Ga—Zn oxide refers to an oxide containing In, Ga, and Zn, and there is no limitation on the ratio of In to Ga and Zn. Further, the In—Ga—Zn oxide may contain a metal element other than In, Ga, and Zn. The In—Ga—Zn oxide has sufficiently high resistance when no electric field is applied thereto, so that off-state current can be sufficiently reduced. Moreover, the In—Ga—Zn oxide has high mobility.

For example, high mobility can be obtained relatively easily in the case of using an In—Sn—Zn oxide. Meanwhile, when an In—Ga—Zn oxide is used, the mobility can be increased by reducing the defect density in a bulk.

In the transistor 90, a metal in the source and drain electrodes might extract oxygen from the oxide semiconductor film depending on a conductive material used for the source and drain electrodes. In such a case, a region of the oxide semiconductor film in contact with the source electrode or the drain electrode becomes an n-type region due to the formation of an oxygen vacancy. The n-type region serves as a source region or a drain region, resulting in a decrease in the contact resistance between the oxide semiconductor film and the source electrode or the drain electrode. Accordingly, the formation of the n-type region increases the mobility and on-state current of the transistor 90, achieving the high-speed operation of a semiconductor device using the transistor 90.

Note that the extraction of oxygen by a metal in the source electrode and the drain electrode is probably caused when the source electrode and the drain electrode are formed by a sputtering method or when heat treatment is performed after the formation of the source electrode and the drain electrode. The n-type region is more likely to be formed by forming the source electrode and the drain electrode with use of a conductive material that is easily bonded to oxygen. Examples of such a conductive material include Al, Cr, Cu, Ta, Ti, Mo, and W.

In the case where the semiconductor film including the stacked oxide semiconductor films is used in the transistor 90, the n-type region preferably extends to the oxide semiconductor film 92b serving as a channel region in order that the mobility and on-state current of the transistor 90 can be further increased and the semiconductor device can operate at higher speed.

The insulating film 91 preferably has a function of supplying part of oxygen to the oxide semiconductor films 92a to 92c by heating. It is preferable that the number of defects in the insulating film 91 be small, and typical spin density at g=2.001 due to a dangling bond of silicon be lower than or equal to $1\times10^{18}$ spins/cm$^3$. The spin density is measured by electron spin resonance (ESR) spectroscopy.

The insulating film 91, which has a function of supplying part of oxygen to the oxide semiconductor films 92a to 92c by heating, is preferably an oxide. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 91 can be formed by a plasma CVD method, a sputtering method, or the like.

Note that in this specification, oxynitride contains more oxygen than nitrogen, and nitride oxide contains more nitrogen than oxygen.

Note that in the transistor 90 illustrated in FIGS. 14A to 14C and FIGS. 15A to 15C, the conductive film 96 overlaps with end portions of the oxide semiconductor film 92b including a channel region that do not overlap with the conductive films 93 and 94, i.e., end portions of the oxide semiconductor film 92b that are in a region different from a region where the conductive films 93 and 94 are located. When the end portions of the oxide semiconductor film 92b are exposed to plasma by etching for forming the end portions, a chlorine radical, a fluorine radical, or other radicals generated from an etching gas are easily bonded to a metal element contained in an oxide semiconductor. For this reason, in the end portions of the oxide semiconductor film, oxygen bonded to the metal element is easily released, so that an oxygen vacancy is easily formed; thus, the end portions of the oxide semiconductor film easily have n-type conductivity. However, an electric field applied to the end portions can be controlled by controlling the potential of the conductive film 96 because the end portions of the oxide semiconductor film 92b that do not overlap with the conductive films 93 and 94 overlap with the conductive film 96 in the transistor 90 illustrated in FIGS. 14A to 14C and FIGS. 15A to 15C. Consequently, current that flows between the conductive films 93 and 94 through the end portions of the oxide semiconductor film 92b can be controlled by the potential applied to the conductive film 96. Such a structure of the transistor 90 is referred to as a surrounded channel (s-channel) structure.

With the s-channel structure, specifically, when a potential at which the transistor 90 is turned off is supplied to the conductive film 96, the amount of off-state current that flows between the conductive films 93 and 94 through the end portions can be reduced. For this reason, in the transistor 90, even when the distance between the conductive films 93 and 94 at the end portions of the oxide semiconductor film 92b is reduced as a result of reducing the channel length to obtain high on-state current, the transistor 90 can have a low off-state current. Consequently, with the short channel length, the transistor 90 can have a high on-state current when in an on state and a low off-state current when in an off state.

With the s-channel structure, specifically, when a potential at which the transistor 90 is turned on is supplied to the conductive film 96, the amount of current that flows between the conductive films 93 and 94 through the end portions of the oxide semiconductor film 92b can be increased. The current contributes to an increase in the field-effect mobility and an increase in the on-state current of the transistor 90. When the end portions of the oxide semiconductor film 92b overlap with the conductive film 96, carriers flow in a wide region of the oxide semiconductor film 92b without being limited to a region in the vicinity of the interface between the oxide semiconductor film 92b and the insulating film 95, which results in an increase in the amount of carrier movement in the transistor 90. As a result, the on-state current of the transistor 90 is increased, and the field-effect mobility is increased to greater than or equal to 10 cm$^2$/V·s or to greater than or equal to 20 cm$^2$/V·s, for example. Note that here, the field-effect mobility is not an approximate value of the mobility as the physical property of the oxide semiconductor film but is the apparent field-effect mobility in a saturation region of the transistor, which is an index of current drive capability.

<Structure of Oxide Semiconductor Film>

A structure of an oxide semiconductor film will be described below. Note that in the following description, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly also includes the case where the angle is greater than or equal to 85° and less than or equal to 95°. Further, in this specification, the trigonal and rhombohedral crystal systems are included in the hexagonal crystal system.

An oxide semiconductor film is classified roughly into a single-crystal oxide semiconductor film and a non-single-crystal oxide semiconductor film. The non-single-crystal oxide semiconductor film includes any of a CAAC-OS film, a polycrystalline oxide semiconductor film, a microcrystalline oxide semiconductor film, an amorphous oxide semiconductor film, and the like.

<CAAC-OS Film>

First, a CAAC-OS film is described.

The CAAC-OS film is one of oxide semiconductor films having a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts can be observed. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to the sample surface, metal atoms are arranged in a layered manner in the crystal parts. Each metal atom layer reflects unevenness of a surface over which the CAAC-OS film is formed (hereinafter, such a surface is referred to as a formation surface) or a top surface of the CAAC-OS film, and is arranged parallel to the formation surface or the top surface of the CAAC-OS film.

According to the high-resolution plan TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has a low density of defect states, and thus has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

<Microcrystalline Oxide Semiconductor Film>

Next, a microcrystalline oxide semiconductor film is described.

A microcrystalline oxide semiconductor film has a region where a crystal part is observed in a high resolution TEM image and a region where a crystal part is not clearly observed in a high resolution TEM image. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high resolution TEM image of the nc-OS film, a grain boundary cannot be found clearly in the nc-OS film sometimes for example.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a diffraction pattern like a halo pattern appears in a selected-area electron diffraction pattern of the nc-OS film which is obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots is shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. However, there is no regularity of crystal orientation between different crystal parts in the nc-OS film; hence, the nc-OS film has a higher density of defect states than the CAAC-OS film.

<Amorphous Oxide Semiconductor Film>

Next, an amorphous oxide semiconductor film is described.

The amorphous oxide semiconductor film has disordered atomic arrangement and no crystal part. For example, the amorphous oxide semiconductor film does not have a specific state as in quartz.

In the high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Further, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (amorphous-like OS) film.

In a high-resolution TEM image of the amorphous-like OS film, a void may be seen. Furthermore, in the high-resolution TEM image, there are a region where a crystal part is clearly observed and a region where a crystal part is not observed. In the amorphous-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the amorphous-like OS film and the nc-OS film can be measured using high-resolution TEM images. For example, an InGaZnO$_4$ crystal has a layered structure in which two Ga—Zn—O layers are included between In—O layers. A unit cell of the InGaZnO$_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Consequently, each of the lattice fringes in which the spacing therebetween is from 0.28 nm to 0.30 nm corresponds to the a-b plane of the InGaZnO$_4$ crystal, focusing on the lattice fringes in the high-resolution TEM image.

Note that an oxide semiconductor film may be a stacked film including two or more films of an amorphous oxide semiconductor film, an amorphous-like OS film, a microcrystalline oxide semiconductor film, and a CAAC-OS film, for example.

This embodiment can be implemented in appropriate combination with any of the other embodiments and the like.

Embodiment 5

In this embodiment, an example of a semiconductor device having a structure different from that in FIG. 13 is described.

Figure 16:
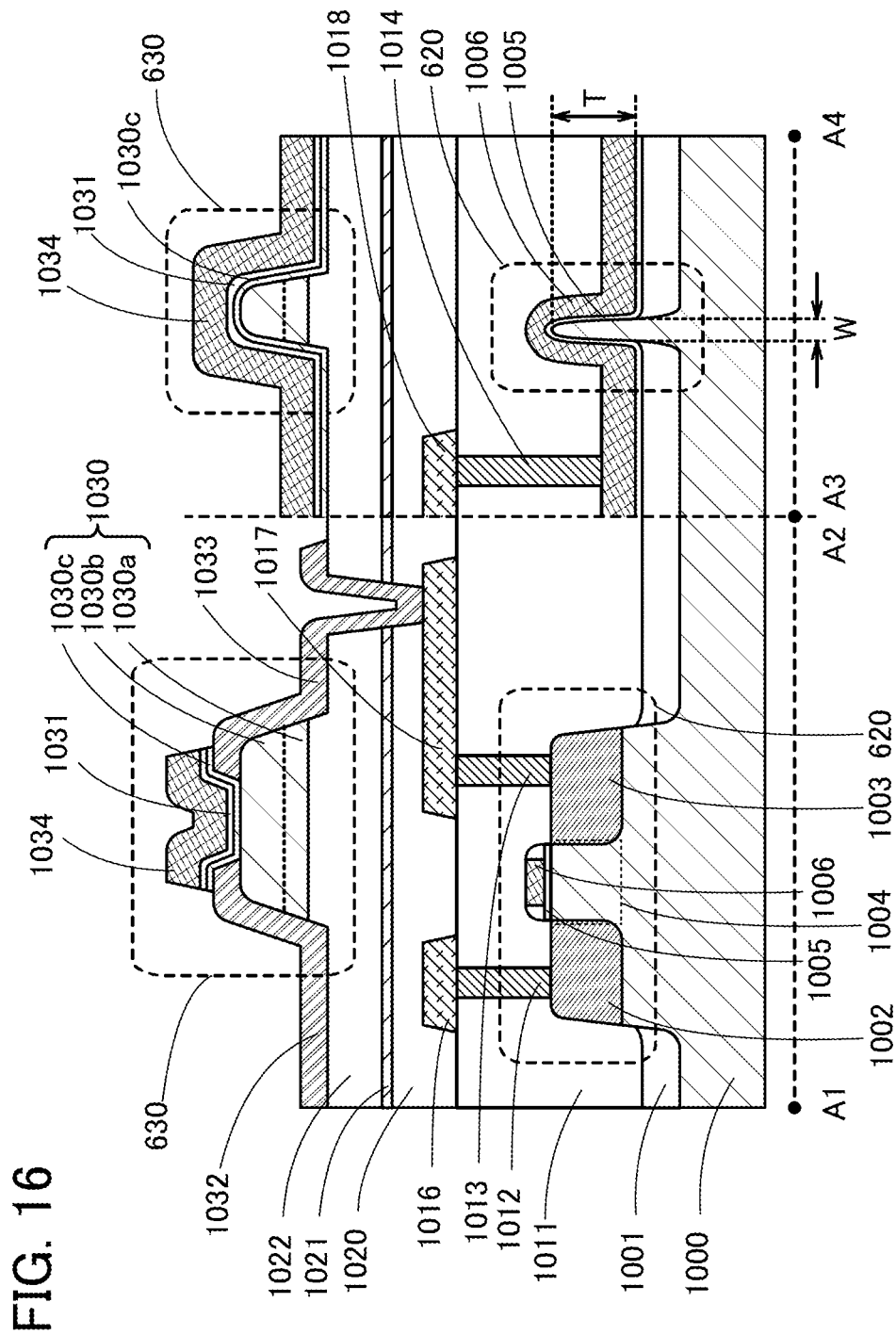
FIG. 16 illustrates an example of a structure of a transistor.

FIG. 16 shows an example of a cross-sectional view of a semiconductor device. In FIG. 16, a region along dashed line A1-A2 shows a structure of the transistors 620 and 630 in the channel length direction, and a region along dashed line A3-A4 shows a structure of the transistors 620 and 630 in the channel width direction. Note that in one embodiment of the present invention, the channel length direction of the transistor 620 is not necessarily the same as the channel length direction of the transistor 630.

The channel length direction refers to a direction in which a carrier moves between a pair of impurity regions functioning as a source region and a drain region by the most direct way, and the channel width direction refers to a direction perpendicular to the channel length direction in a plane parallel to a substrate.

In the example illustrated in FIG. 16, the transistor 630 that is an OS transistor is formed over the transistor 620 that is a Si transistor. Such a structure in which a Si transistor and an OS transistor are stacked can be appropriately used for the transistors included in the circuit illustrated in FIGS. 1A to 1C, FIGS. 2A to 2C, FIGS. 3A and 3B, FIG. 4, FIG. 5, FIG. 6, FIG. 9, and FIG. 10. Note that in this embodiment, one of the source and the drain of the transistor 620 is connected to one of the source and the drain of the transistor 630 as in FIG. 11D, however, one embodiment of the present invention is not limited to this example. One of the source and the drain of the transistor 620 may be connected to the gate of the transistor 630 (see FIG. 12A), the gate of the transistor 620 may be connected to one of the source and the drain of the transistor 630 (see FIG. 12B), or the gate of the transistor 620 may be connected to the gate of the transistor 630 (see FIG. 12C).

The transistor 620 may include the channel formation region in a semiconductor film or a semiconductor substrate of silicon, germanium, or the like in an amorphous, microcrystalline, polycrystalline, or single crystal state. Alternatively, the transistor 620 may include the channel formation region in an oxide semiconductor film or an oxide semiconductor substrate. In the case where the transistors each include a channel formation region in an oxide semiconductor film or an oxide semiconductor substrate, the transistor 630 is not necessarily stacked over the transistor 620, and the transistors 630 and 620 may be formed in the same layer.

In the case where the transistor 620 is formed using a thin silicon film, any of the following can be used in the thin film: amorphous silicon formed by a sputtering method or a vapor phase growth method such as a plasma CVD method; polycrystalline silicon obtained by crystallization of amorphous silicon by treatment such as laser irradiation; single crystal silicon obtained by separation of a surface portion of a single crystal silicon wafer by implantation of hydrogen ions or the like into the silicon wafer; and the like.

A substrate 1000 where the transistor 620 is formed can be, for example, a silicon substrate, a germanium substrate, or a silicon germanium substrate. In FIG. 16, a single crystal silicon substrate is used as the substrate 1000.

The transistor 620 is electrically isolated by an element isolation method. As the element isolation method, a trench isolation method or the like can be used. FIG. 16 illustrates an example where the trench isolation method is used to electrically isolate the transistor 620. Specifically, in FIG. 16, an element isolation region 1001 is formed in such a manner that an insulator including silicon oxide or the like is buried in a trench formed in the substrate 1000 by etching or the like and then the insulator is removed partly by etching or the like, so that the transistor 620 is electrically isolated by element isolation.

In a projection of the substrate 1000 that exists in a region other than the trench, an impurity region 1002 and an impurity region 1003 of the transistor 620 and a channel formation region 1004 placed between the impurity regions 1002 and 1003 are provided. Furthermore, the transistor 620 includes an insulating film 1005 covering the channel formation region 1004 and a gate electrode 1006 that overlaps with the channel formation region 1004 with the insulating film 1005 provided therebetween.

In the transistor 620, a side portion and an upper portion of the projection in the channel formation region 1004 overlap with the gate electrode 1006 with the insulating film 1005 positioned therebetween, so that carriers flow in a wide area including the side portion and the upper portion of the channel formation region 1004. Therefore, an area over the substrate occupied by the transistor 620 can be reduced, and the number of transferred carriers in the transistor 620 can be increased. As a result, the on-state current and field-effect mobility of the transistor 620 are increased. Suppose the length in the channel width direction (channel width) of the projection in the channel formation region 1004 is W, and the thickness of the projection in the channel formation region 1004 is T. As the aspect ratio of the thickness T to the channel width W increases, a region where carriers flow becomes larger. Thus, the on-state current of the transistor 620 can be further increased and the field-effect mobility of the transistor 620 can be further increased.

Note that when the transistor 620 is formed using a bulk semiconductor substrate, the aspect ratio is preferably 0.5 or more, further preferably 1 or more.

An insulating film 1011 is provided over the transistor 620. Opening portions are formed in the insulating film 1011. Conductive films 1012 and 1013 that are electrically connected to the impurity regions 1002 and 1003, respectively, and a conductive film 1014 that is electrically connected to the gate electrode 1006 are formed in the opening portions.

The conductive film 1012 is electrically connected to a conductive film 1016 formed over the insulating film 1011. The conductive film 1013 is electrically connected to a conductive film 1017 formed over the insulating film 1011. The conductive film 1014 is electrically connected to a conductive film 1018 formed over the insulating film 1011.

An insulating film 1020 is provided over the conductive films 1016 to 1018. An insulating film 1021 having a blocking effect of preventing diffusion of oxygen, hydrogen, and water is provided over the insulating film 1020. As the insulating film 1021 has higher density and becomes denser or has a fewer dangling bonds and becomes more chemically stable, the insulating film 1021 has a higher blocking effect. The insulating film 1021 that has the effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. The insulating film 1021 having an effect of blocking diffusion of hydrogen and water can be formed using, for example, silicon nitride or silicon nitride oxide.

An insulating film 1022 is provided over the insulating film 1021, and the transistor 630 is provided over the insulating film 1022.

The transistor 630 includes, over the insulating film 1022, a semiconductor film 1030 including an oxide semiconductor, conductive films 1032 and 1033 functioning as source and drain electrodes and electrically connected to the semiconductor film 1030, a gate insulating film 1031 covering the semiconductor film 1030, and a gate electrode 1034 overlapping with the semiconductor film 1030 with the gate insulating film 1031 positioned therebetween. Note that an opening portion is formed in the insulating films 1020 to 1022. The conductive film 1033 is connected to the conductive film 1017 in the opening portion.

Note that in FIG. 16, the transistor 630 includes at least the gate electrode 1034 on one side of the semiconductor film 1030, and may further include a gate electrode overlapping with the semiconductor film 1030 with the insulating film 1022 positioned therebetween.

In the case where the transistor 630 has a pair of gate electrodes, one of the gate electrodes may be supplied with a signal for controlling the on/off state, and the other of the gate electrodes may be supplied with a potential from another element. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 16, the transistor 630 has a single-gate structure where one channel formation region corresponding to one gate electrode 1034 is provided. However, the transistor 630 may have a multi-gate structure where a plurality of electrically connected gate electrodes are provided so that a plurality of channel formation regions are included in one active layer.

FIG. 16 illustrates an example in which the semiconductor film 1030 included in the transistor 630 includes oxide semiconductor films 1030a to 1030c that are stacked in this order over the insulating film 1022. Note that in one embodiment of the present invention, the semiconductor film 1030 of the transistor 630 may be formed using a single-layer metal oxide film.

This embodiment can be implemented in appropriate combination with any of the other embodiments.

Embodiment 6

The variety of films disclosed in the other embodiments, such as the conductive films, the semiconductor films, and the insulating films can be formed by a sputtering method or a plasma CVD method; however, such films may be formed by another method, e.g., a thermal CVD (chemical vapor deposition) method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time, the pressure in the chamber is set to an atmospheric pressure or a reduced pressure, and reaction is caused in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, an inert gas (e.g., argon or nitrogen) or the like is introduced when or after a first source gas is introduced so that the source gases are not mixed, and then a second source gas is introduced. Note that in the case where the inert gas is introduced at the same time as the first source gas, the inert gas serves as a carrier gas, and the inert gas may also be introduced at the same time as the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the conductive film, the semiconductor film, and the insulating film which have been disclosed in the embodiments can be formed by a thermal CVD method such as a MOCVD method or an ALD method. For example, in the case where an In—Ga—Zn—O film is formed, trimethylindium, trimethylgallium, and dimethylzinc can be used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed with a deposition apparatus employing ALD, two kinds of gases, i.e., ozone ($O_3$) as an oxidizer and a source material gas which is obtained by vaporizing liquid containing a solvent and a hafnium precursor compound (hafnium alkoxide or hafnium amide such as tetrakis(dimethylamide) hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed using a deposition apparatus employing ALD, two kinds of gases, e.g., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed with a deposition apparatus employing ALD, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus employing ALD, an $In(CH_3)_3$ gas and an $O_3$ gas are sequentially introduced plural times to form an In—O layer, a $Ga(CH_3)_3$ gas and an $O_3$ gas are introduced at a time to form a Ga—O layer, and then a $Zn(CH_3)_2$ gas and an $O_3$ gas are introduced at a time to form a Zn—O layer. Note that the order of these layers is not limited to this example. A mixed compound layer such as an In—Ga—O layer, an In—Zn—O layer, or a Ga—Zn—O layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

This embodiment can be implemented in appropriate combination with any of the other embodiments.

Embodiment 7

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are cellular phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and medical devices. FIGS. 17A to 17F illustrate specific examples of these electronic devices.

Figure 17A:
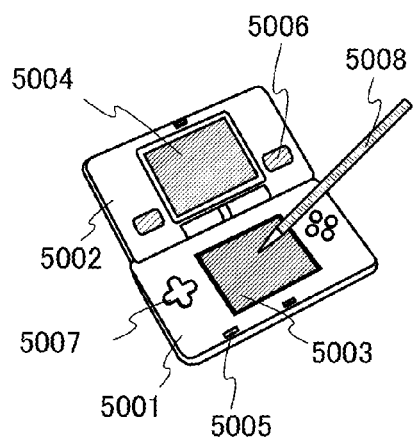
FIGS. 17A to 17F each illustrate an electronic device.

FIG. 17A illustrates a portable game machine, which includes a housing 5001, a housing 5002, a display portion 5003, a display portion 5004, a microphone 5005, a speaker 5006, an operation key 5007, a stylus 5008, and the like. The semiconductor device of one embodiment of the present invention can be used for a variety of integrated circuits included in portable game machines. Although the portable game machine in FIG. 17A has the two display portions 5003 and 5004, the number of display portions included in a portable game machine is not limited to this.

Figure 17B:
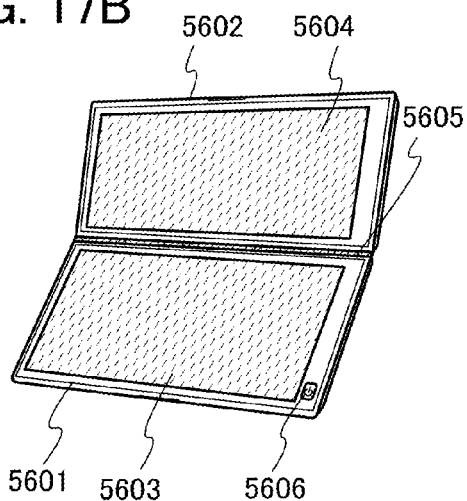

FIG. 17B illustrates a portable information terminal including a first housing 5601, a second housing 5602, a first display portion 5603, a second display portion 5604, a joint 5605, an operation key 5606, and the like. The semiconductor device of one embodiment of the present invention can be used for a variety of integrated circuits included in portable information terminals. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images displayed on the first display portion 5603 may be switched in accordance with the angle at the joint 5605 between the first housing 5601 and the second housing 5602. A display device with a position input function may be used as at least one of the first display portion 5603 and the second display portion 5604. Note that the position input function can be added by providing a touch panel in a display device. Alternatively, the position input function can be added by provision of a photoelectric conversion element called a photosensor in a pixel portion of a display device.

Figure 17C:
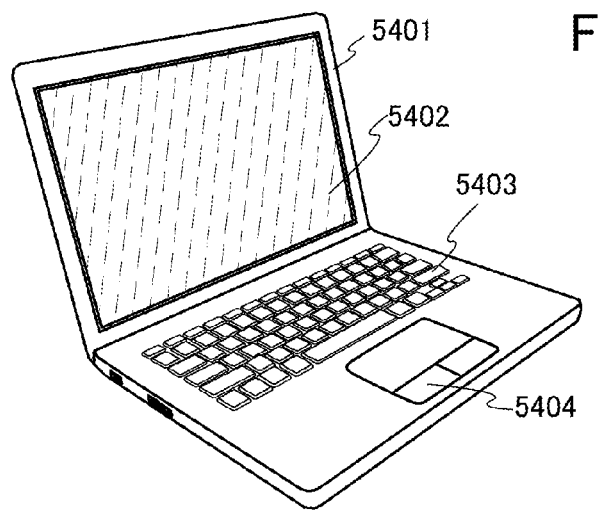

FIG. 17C illustrates a notebook type personal computer including a housing 5401, a display portion 5402, a keyboard 5403, a pointing device 5404, and the like. The semiconductor device of one embodiment of the present invention can be used for a variety of integrated circuits included in notebook type personal computers.

Figure 17D:
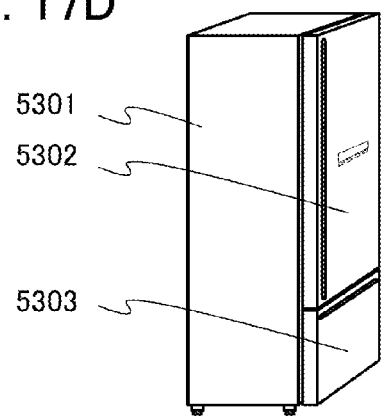

FIG. 17D illustrates an electric refrigerator-freezer including a housing 5301, a refrigerator door 5302, a freezer door 5303, and the like. The semiconductor device of one embodiment of the present invention can be used for a variety of integrated circuits included in electric refrigerator-freezers.

Figure 17E:
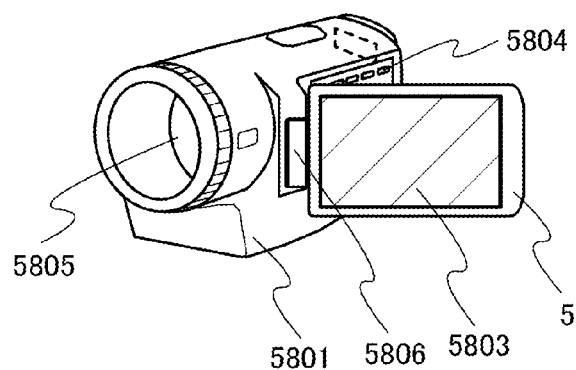

FIG. 17E illustrates a video camera including a first housing 5801, a second housing 5802, a display portion 5803, operation keys 5804, a lens 5805, a joint 5806, and the like. The semiconductor device of one embodiment of the present invention can be used for a variety of integrated circuits included in video cameras. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 17F:
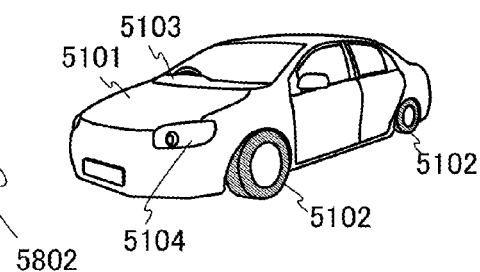

FIG. 17F illustrates a passenger car including a car body 5101, wheels 5102, a dashboard 5103, lights 5104, and the like. The semiconductor device of one embodiment of the present invention can be used for a variety of integrated circuits included in passenger cars.

This embodiment can be implemented in appropriate combination with any of the other embodiments.

This application is based on Japanese Patent Application serial no. 2014-081616 filed with Japan Patent Office on Apr. 11, 2014, the entire contents of which are hereby incorporated by reference.

What is claimed is:

1. A semiconductor device comprising:
   a memory circuit comprising a first transistor over a single crystal semiconductor substrate, the first transistor including a first channel formation region provided in the single crystal semiconductor substrate;
   an insulating layer over the memory circuit; and
   an amplifier circuit comprising a second transistor over the insulating layer, the second transistor including a second channel formation region provided in an oxide semiconductor layer,
   wherein the memory circuit and the amplifier circuit are electrically connected to each other, and
   wherein the memory circuit and the amplifier circuit comprise mutually overlapping regions.

2. The semiconductor device according to claim 1, wherein the first channel formation region and the second channel formation region comprise mutually overlapping regions.

3. The semiconductor device according to claim 1, wherein one of a source and a drain of the first transistor is electrically connected to one of a source and a drain of the second transistor.

4. The semiconductor device according to claim 1, further comprising a conductive layer that is provided in an opening formed in the insulating layer and electrically connects the memory circuit and the amplifier circuit.

5. The semiconductor device according to claim 1, wherein the oxide semiconductor layer contains In, Zn, and a metal selected from Al, Ti, Ga, Y, Zr, La, Ce, Nd, and Hf.

6. An electronic device comprising the semiconductor device according to claim 1 and at least one of a display device, a speaker, and a microphone.

7. A semiconductor device comprising:
   an integrated circuit comprising a first transistor over a single crystal semiconductor substrate, the first transistor including a first channel formation region provided in the single crystal semiconductor substrate;
   an insulating layer over the integrated circuit;
   a memory circuit comprising a second transistor over the insulating layer, the second transistor including a second channel formation region provided in a first oxide semiconductor layer;
   an amplifier circuit comprising a third transistor over the insulating layer, the third transistor including a third channel formation region provided in a second oxide semiconductor layer,
   wherein the memory circuit and the amplifier circuit are electrically connected to each other,
   wherein the amplifier circuit and the integrated circuit are electrically connected to each other, and
   wherein the integrated circuit and one of the memory circuit and the amplifier circuit comprise mutually overlapping regions.

8. The semiconductor device according to claim 7, wherein the first channel formation region and one of the second and third channel formation regions comprise mutually overlapping regions.

9. The semiconductor device according to claim 7, wherein one of a source and a drain of the first transistor is electrically connected to one of a source and a drain of the third transistor.

10. The semiconductor device according to claim 7, further comprising a conductive layer that is provided in an opening formed in the insulating layer and electrically connects the integrated circuit and the amplifier circuit.

11. The semiconductor device according to claim 7, further comprising:
    a second insulating layer between the second transistor and the third transistor; and
    a conductive layer that is provided in an opening formed in the second insulating layer and electrically connects the memory circuit and the amplifier circuit,
    wherein the memory circuit and the amplifier circuit comprise mutually overlapping regions.

12. The semiconductor device according to claim 11, wherein the memory circuit is provided over the amplifier circuit.

13. The semiconductor device according to claim 7, wherein the first and second oxide semiconductor layers each contain In, Zn, and a metal selected from Al, Ti, Ga, Y, Zr, La, Ce, Nd, and Hf.

14. An electronic device comprising the semiconductor device according to claim 7 and at least one of a display device, a speaker, and a microphone.

15. A semiconductor device comprising:
    an integrated circuit comprising a first transistor over a single crystal semiconductor substrate, the first transistor including a first channel formation region provided in the single crystal semiconductor substrate;
    a first insulating layer over the integrated circuit;
    a memory circuit comprising a second transistor over the first insulating layer, the second transistor including a second channel formation region provided in a first oxide semiconductor layer;

a second insulating layer over the memory circuit; and an amplifier circuit comprising a third transistor over the second insulating layer, the third transistor including a third channel formation region provided in a second oxide semiconductor layer, wherein the memory circuit and the amplifier circuit are electrically connected to each other, wherein the amplifier circuit and the integrated circuit are electrically connected to each other, and wherein the integrated circuit, the memory circuit, and the amplifier circuit comprise mutually overlapping regions.

16. The semiconductor device according to claim 15, further comprising:

a first conductive layer that is provided in a first opening formed in the first and second insulating layers and electrically connects the integrated circuit and the amplifier circuit; and a second conductive layer that is provided in a second opening formed in the second insulating layer and electrically connects the memory circuit and the amplifier circuit.

17. The semiconductor device according to claim 15, wherein the second channel formation region and the third channel formation region comprise mutually overlapping regions.

18. The semiconductor device according to claim 15, wherein one of a source and a drain of the second transistor is electrically connected to one of a source and a drain of the third transistor.

19. The semiconductor device according to claim 15, wherein the first and second oxide semiconductor layers each contain In, Zn, and a metal selected from Al, Ti, Ga, Y, Zr, La, Ce, Nd, and Hf.

20. An electronic device comprising the semiconductor device according to claim 15 and at least one of a display device, a speaker, and a microphone.

* * * * *